US011112700B2

(12) United States Patent
Tel et al.

(10) Patent No.: US 11,112,700 B2
(45) Date of Patent: Sep. 7, 2021

(54) OPTIMIZATION OF A LITHOGRAPHIC PROJECTION APPARATUS ACCOUNTING FOR AN INTERLAYER CHARACTERISTIC

(71) Applicant: ASML NETHERLANDS B.V., Veldhoven (NL)

(72) Inventors: Wim Tjibbo Tel, Helmond (NL); Laurent Michel Marcel Depre, Revel (FR); Jorge Humberto Salvador Entradas, Corenc (FR)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/087,338

(22) PCT Filed: Mar. 14, 2017

(86) PCT No.: PCT/EP2017/055912
§ 371 (c)(1),
(2) Date: Sep. 21, 2018

(87) PCT Pub. No.: WO2017/162471
PCT Pub. Date: Sep. 28, 2017

(65) Prior Publication Data
US 2019/0137889 A1 May 9, 2019

Related U.S. Application Data

(60) Provisional application No. 62/312,987, filed on Mar. 24, 2016.

(51) Int. Cl.
*G03F 7/20* (2006.01)
*G06F 30/398* (2020.01)

(52) U.S. Cl.
CPC .......... *G03F 7/70433* (2013.01); *G03F 7/705* (2013.01); *G03F 7/7065* (2013.01);
(Continued)

(58) Field of Classification Search
CPC .... G03F 7/70433; G03F 7/7065; G03F 7/705; G03F 7/70125; G03F 7/70558; G06F 17/5081; G06F 30/398
See application file for complete search history.

(56) References Cited

U.S. PATENT DOCUMENTS 5,229,872 A 7/1993 Mumola
5,296,891 A 3/1994 Vogt et al.
(Continued)

OTHER PUBLICATIONS

Chen, A., et al.: "Layer Aware Source Mask Target Optimization", Proc. of SPIE, vol. 9780, Mar. 15, 2016, pp. 97801A-1-97801A-9.
(Continued)

*Primary Examiner* — Stacy Whitmore
(74) *Attorney, Agent, or Firm* — Pillsbury Winthrop Shaw Pittman LLP

(57) ABSTRACT

A method to improve a lithographic process of imaging a portion of a design layout onto a substrate using a lithographic apparatus, the method including computing a multi-variable cost function. The multi-variable cost function represents an interlayer characteristic, the interlayer characteristic being a function of a plurality of design variables that represent one or more characteristics of the lithographic process. The method further includes reconfiguring one or more of the characteristics of the lithographic process by adjusting one or more of the design variables and computing the multi-variable cost function with the adjusted one or more design variables, until a certain termination condition is satisfied.

20 Claims, 16 Drawing Sheets

(52) U.S. Cl.
CPC ........ *G03F 7/70125* (2013.01); *G06F 30/398* (2020.01); *G03F 7/70558* (2013.01)

(56) References Cited

U.S. PATENT DOCUMENTS

| | | | |
|---|---|---|---|
| 5,523,193 | A | 6/1996 | Nelson |
| 6,046,792 | A | 4/2000 | Van Der Werf et al. |
| 7,587,704 | B2 | 9/2009 | Ye et al. |
| 2009/0157360 | A1 | 6/2009 | Ye et al. |
| 2012/0042290 | A1 | 2/2012 | Berkens et al. |
| 2013/0179847 | A1* | 7/2013 | Hansen .................. G06F 17/50 716/54 |
| 2015/0089459 | A1 | 3/2015 | Liu |
| 2016/0110488 | A1* | 4/2016 | Hansen .................. G06F 17/50 716/54 |
| 2016/0231654 | A1* | 8/2016 | Hsu ..................... G03F 7/70125 |
| 2017/0139320 | A1* | 5/2017 | Liu ..................... G03F 7/70125 |
| 2018/0011407 | A1* | 1/2018 | Hsu ..................... G03F 7/70625 |
| 2019/0155145 | A1* | 5/2019 | Liu ..................... G03F 7/70125 |
| 2019/0155165 | A1* | 5/2019 | Liu ..................... G03F 7/70116 |
| 2019/0204749 | A1* | 7/2019 | Tel ......................... G03F 7/705 |
| 2019/0285991 | A1* | 9/2019 | Hsu ..................... G03F 7/70483 |

OTHER PUBLICATIONS

International Search Report and Written Opinion issued in corresponding PCT Patent Application No. PCT/EP2017/055912, dated Jun. 28, 2017.

* cited by examiner

OPTIMIZATION OF A LITHOGRAPHIC PROJECTION APPARATUS ACCOUNTING FOR AN INTERLAYER CHARACTERISTIC

CROSS-REFERENCE TO RELATED APPLICATIONS

This application is the U.S. national phase entry of PCT patent application no. PCT/EP2017/055912, which was filed on Mar. 14, 2017, which claims the benefit of priority of U.S. provisional application No. 62/312,987, which was filed on Mar. 24, 2016, and which is incorporated herein in its entirety by reference.

TECHNICAL FIELD

The description herein relates to lithographic apparatuses and processes, and more particularly to a method or apparatus to optimize an illumination source, a patterning device, or projection optics for use in a lithographic apparatus or process, with an interlayer characteristic taken into account.

BACKGROUND

A lithographic projection apparatus can be used, for example, in the manufacture of integrated circuits (ICs). In such a case, a patterning device (e.g., a mask) may contain or provide a circuit pattern corresponding to an individual layer of the IC ("design layout"), and this circuit pattern can be transferred onto a target portion (e.g. comprising one or more dies) on a substrate (e.g., silicon wafer) that has been coated with a layer of radiation-sensitive material ("resist"), by methods such as irradiating the target portion through the circuit pattern on the patterning device. In general, a single substrate contains a plurality of adjacent target portions to which the circuit pattern is transferred successively by the lithographic projection apparatus, one target portion at a time. In one type of lithographic projection apparatuses, the circuit pattern on the entire patterning device is transferred onto one target portion in one go; such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the circuit pattern on the patterning device are transferred to one target portion progressively. Since, in general, the lithographic projection apparatus will have a magnification factor M (generally <1), the speed F at which the substrate is moved will be a factor M times that at which the projection beam scans the patterning device. More information with regard to lithographic devices as described herein can be gleaned, for example, from U.S. Pat. No. 6,046,792, incorporated herein by reference.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

As noted, lithography is a central step in the manufacturing of ICs, where patterns formed on substrates define functional elements of the ICs, such as microprocessors, memory chips etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-$k_1$ lithography, according to the resolution formula $CD=k_1 \times \lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed-and $k_1$ is an empirical resolution factor. In general, the smaller $k_1$ the more difficult it becomes to reproduce a pattern on the substrate that resembles the shape and dimensions planned by a circuit designer in order to achieve particular electrical functionality and performance. To overcome these difficulties, sophisticated fine-tuning steps are applied to the lithographic projection apparatus and/or design layout. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

BRIEF SUMMARY

Disclosed herein is a method to improve a lithographic process of imaging a portion of a design layout onto a substrate using a lithographic apparatus, the method comprising: computing, by a computer, a multi-variable cost function, the multi-variable cost function representing an interlayer characteristic, the interlayer characteristic being a function of a plurality of design variables that represent one or more characteristics of the lithographic process; and reconfiguring one or more of the characteristics of the lithographic process by adjusting one or more of the design variables until a certain termination condition is satisfied.

According to an embodiment, the interlayer characteristic is a distance between a first edge of a first pattern and a second edge of a second pattern, wherein the first edge faces the second edge; wherein the first pattern and the second pattern do not overlap; wherein the first pattern and the second pattern are in different layers on the substrate.

According to an embodiment, the interlayer characteristic is a distance between a first edge of a first pattern and a second edge of a second pattern; wherein the first pattern and the second pattern overlap; wherein the first pattern and the second pattern are in different layers on the substrate.

According to an embodiment, the interlayer characteristic is an overlapping area between a first pattern and a second pattern; wherein the first pattern and the second pattern are in different layers on the substrate.

According to an embodiment, the interlayer characteristic is a distance between a first edge of a first pattern and a second edge of a second pattern; wherein the first pattern and the second pattern do not overlap; wherein the first edge and the second edge do not face each other.

According to an embodiment, the first pattern is a structure etched into the substrate.

According to an embodiment, the second pattern is a pattern in an aerial image, in a resist image, or in an etched image.

According to an embodiment, computing the multi-variable cost function comprises simulating the first pattern or the second pattern.

According to an embodiment, reconfiguring the one or more of the characteristics of the lithographic process improves an image quality of the portion of the design layout.

According to an embodiment, reconfiguring the one or more of the characteristics of the lithographic process increases latitude of at least one of the design variables.

According to an embodiment, the latitude is depth of focus or exposure latitude.

According to an embodiment, reconfiguring the one or more of the characteristics of the lithographic process increases a size of a process window.

According to an embodiment, the cost function represents one or more selected from the following: edge placement error, critical dimension, resist contour distance, worst defect size, overlapping area of two contours and/or best focus shift.

According to an embodiment, the portion of the design layout comprises one or more selected from the following: an entire design layout, a clip, a section of a design layout that is known to have a critical feature, a section of the design layout where a hot spot or a warm spot has been identified, and/or a section of the design layout where a critical feature has been identified.

According to an embodiment, the termination condition comprises one or more selected from the following: minimization of the cost function; maximization of the cost function; reaching a certain number of iterations; reaching a value of the cost function equal to or beyond a certain threshold value; reaching a certain computation time; reaching a value of the cost function within an acceptable error limit; and/or minimizing an exposure time in the lithographic process.

According to an embodiment, one or more of the design variables represent one or more characteristics of an illumination by the lithographic apparatus, and/or one or more of the design variables represented one or more characteristics of the design layout, and/or one or more of the design variables represent one or more characteristics of projection optics of the lithographic apparatus, and/or one or more of the design variables represent one or more characteristics of a resist of the substrate, and/or one or more of the design variables represent one or more characteristics of an aerial image or a resist image.

According to an embodiment, the aerial image or the resist image is a simulated image.

According to an embodiment, the reconfiguration comprises a constraint dictating a range of at least one of the design variables.

According to an embodiment, the cost function is minimized or maximized by a method selected from a group consisting of the Gauss-Newton algorithm, the Levenberg-Marquardt algorithm, the Broyden-Fletcher-Goldfarb-Shanno algorithm, the gradient descent algorithm, the simulated annealing algorithm, the interior point algorithm, and the genetic algorithm.

Also disclosed herein is a computer program product comprising a computer non-transitory readable medium having instructions recorded thereon, the instructions when executed by a computer implementing any of the methods above.

DETAILED DESCRIPTION

Figure 1:
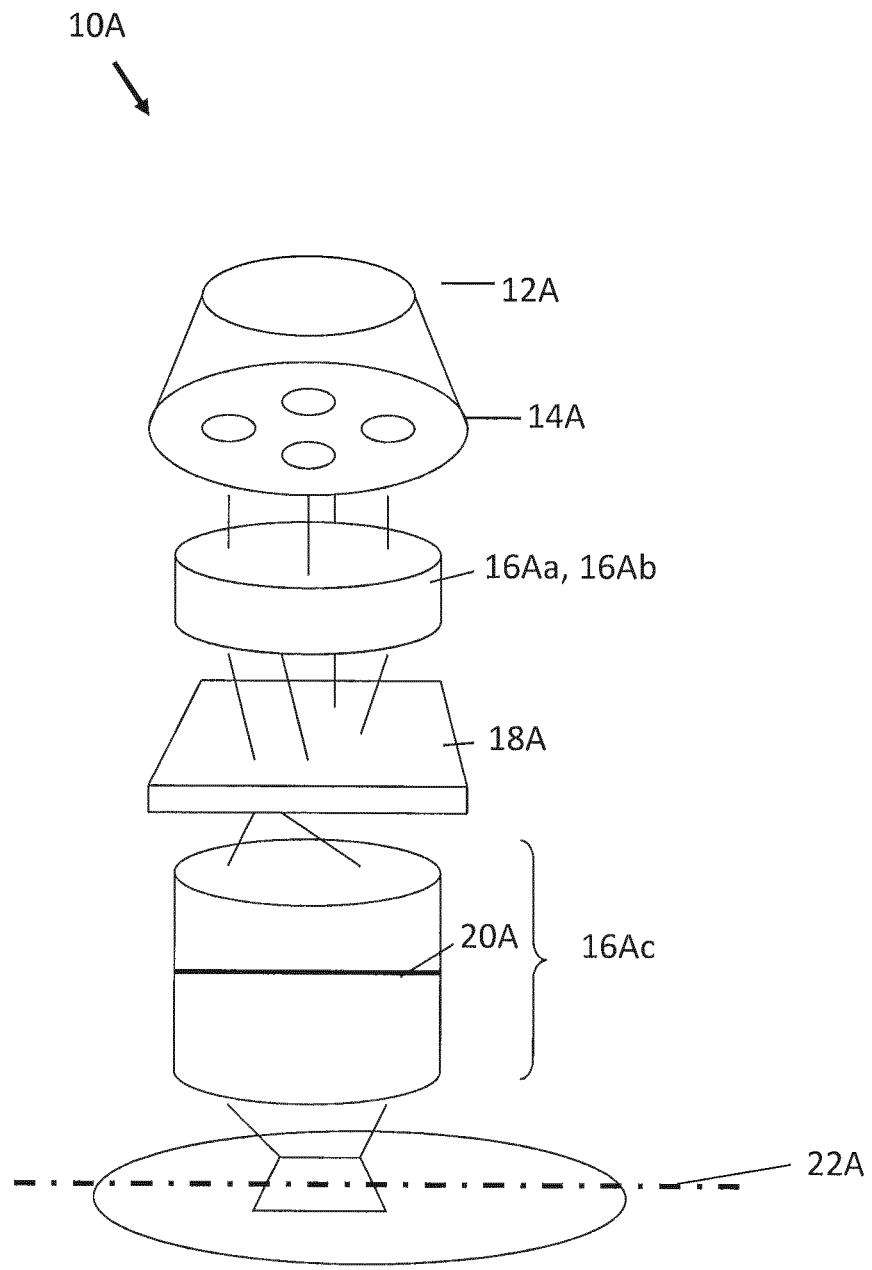
FIG. 1 is a block diagram of various subsystems of a lithography system.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "optimizing" and "optimization" as used herein refers to or means adjusting a lithographic projection apparatus, a lithographic process, etc. such that results and/or processes of lithography have more desirable characteristics, such as higher accuracy of projection of a design layout on a substrate, a larger process window, etc. Thus, the term "optimizing" and "optimization" as used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

Further, the lithographic projection apparatus may be of a type having two or more tables (e.g., two or more substrate table, a substrate table and a measurement table, two or more patterning device tables, etc.). In such "multiple stage" devices a plurality of the multiple tables may be used in parallel, or preparatory steps may be carried out on one or more tables while one or more other tables are being used for exposures. Twin stage lithographic projection apparatuses are described, for example, in U.S. Pat. No. 5,969,441, incorporated herein by reference.

The patterning device referred to above comprises, or can form, one or more design layouts. The design layout can be generated utilizing CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between circuit devices (such as gates, capacitors, etc.) or interconnect lines, so as to ensure that the circuit devices or lines do not interact with one another in an undesirable way. One or more of the design rule limitations may be referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.

a programmable LCD array. An example of such a construction is given in U.S. Pat. No. 5,229,872, which is incorporated herein by reference.

As a brief introduction, FIG. 1 illustrates an exemplary lithographic projection apparatus 10A. Major components are a radiation source 12A, which may be a deep-ultraviolet excimer laser source or other type of source including an extreme ultra violet (EUV) source (as discussed above, the lithographic projection apparatus itself need not have the radiation source), illumination optics which define the partial coherence (denoted as sigma) and which may include optics 14A, 16Aa and 16Ab that shape radiation from the source 12A; a patterning device 14A; and transmission optics 16Ac that project an image of the patterning device pattern onto a substrate plane 22A. An adjustable filter or aperture 20A at the pupil plane of the projection optics may restrict the range of beam angles that impinge on the substrate plane 22A, where the largest possible angle defines the numerical aperture of the projection optics NA=n sin $(\Theta_{max})$, n is the Index of Refraction of the media between the last element of projection optics and the substrate, and $\Theta_{max}$ is the largest angle of the beam exiting from the projection optics that can still impinge on the substrate plane 22A.

In an optimization process of a system, a figure of merit of the system can be represented as a cost function. The optimization process boils down to a process of finding a set of parameters (design variables) of the system that optimizes (e.g., minimizes or maximizes) the cost function. The cost function can have any suitable form depending on the goal of the optimization. For example, the cost function can be weighted root mean square (RMS) of deviations of certain characteristics of the system with respect to the intended values (e.g., ideal values) of these characteristics; the cost function can also be the maximum of these deviations (i.e., worst deviation). The design variables of the system can be confined to finite ranges and/or be interdependent due to practicalities of implementations of the system. In the case of a lithographic projection apparatus, the constraints are often associated with physical properties and characteristics of the hardware such as tunable ranges, and/or patterning device manufacturability design rules.

In a lithographic projection apparatus, a source provides illumination (i.e. radiation) to a patterning device and projection optics direct and shape the illumination, via the patterning device, onto a substrate. The term "projection optics" is broadly defined here to include any optical component that may alter the wavefront of the radiation beam. For example, projection optics may include at least some of the components 14A, 16Aa, 16Ab and 16Ac. An aerial image (AI) is the radiation intensity distribution at substrate level. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in U.S. Patent Application Publication No. US 2009-0157360, the disclosure of which is hereby incorporated by reference in its entirety. The resist model is related only to properties of the resist layer (e.g., effects of chemical processes which occur during exposure, PEB and development). Optical properties of the lithographic projection apparatus (e.g., properties of the source, the patterning device and the projection optics) dictate the aerial image. Since the patterning device used in the lithographic projection apparatus can be changed, it may be desirable to separate the optical properties of the patterning device from the optical properties of the rest of the lithographic projection apparatus including at least the source and the projection optics.

Figure 2:
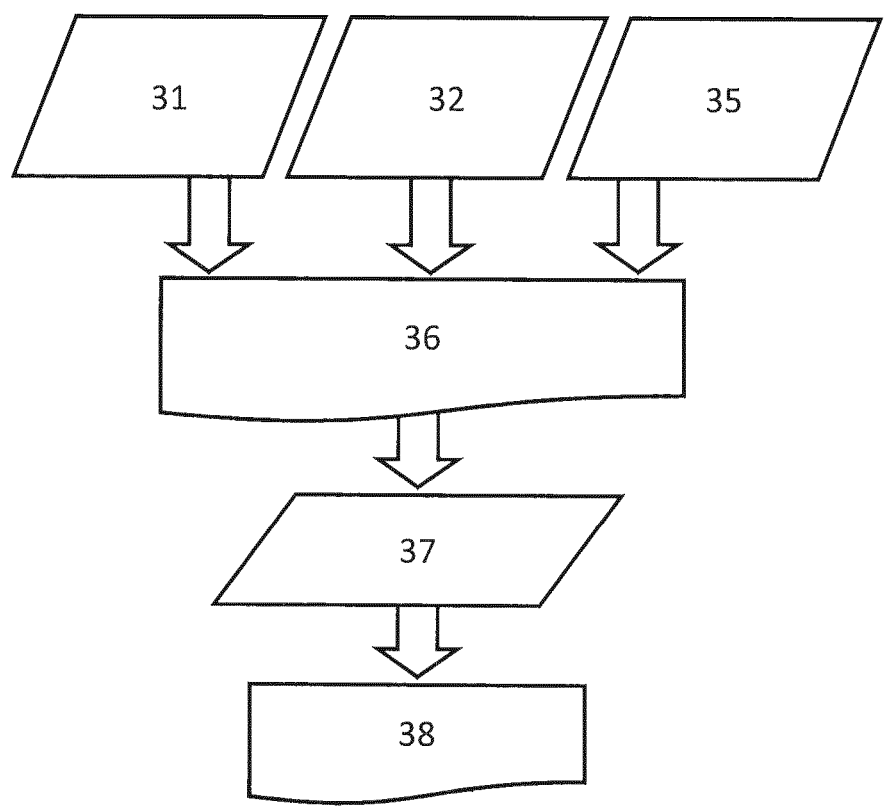
FIG. 2 is a block diagram of simulation models corresponding to the subsystems in FIG. 1.

An exemplary flow chart for simulating lithography in a lithographic projection apparatus is illustrated in FIG. 2. A source model 31 represents optical characteristics (including radiation intensity distribution and/or phase distribution) of the source. A projection optics model 32 represents optical characteristics (including changes to the radiation intensity distribution and/or the phase distribution caused by the projection optics) of the projection optics. A design layout model 35 represents optical characteristics (including changes to the radiation intensity distribution and/or the phase distribution caused by a given design layout 33) of a design layout, which is the representation of an arrangement of features on or formed by a patterning device. An aerial image 36 can be simulated from the design layout model 35, the projection optics model 32 and the design layout model 35. A resist image 38 can be simulated from the aerial image 36 using a resist model 37. Simulation of lithography can, for example, predict contours and CDs in the resist image.

More specifically, it is noted that the source model 31 can represent the optical characteristics of the source that include, but not limited to, numerical aperture settings, illumination sigma (σ) settings as well as any particular illumination shape (e.g. off-axis radiation sources such as annular, quadrupole, dipole, etc.). The projection optics model 32 can represent the optical characteristics of the projection optics, including aberration, distortion, one or more refractive indexes, one or more physical sizes, one or more physical dimensions, etc. The design layout model 35 can represent one or more physical properties of a physical patterning device, as described, for example, in U.S. Pat. No. 7,587,704, which is incorporated by reference in its entirety. The objective of the simulation is to accurately predict, for example, edge placement, aerial image intensity slope and/or CD, which can then be compared against an intended design. The intended design is generally defined as a pre-OPC design layout which can be provided in a standardized digital file format such as GDSII or OASIS or other file format.

From this design layout, one or more portions may be identified, which are referred to as "clips". In an embodiment, a set of clips is extracted, which represents the complicated patterns in the design layout (typically about 50 to 1000 clips, although any number of clips may be used). These patterns or clips represent small portions (i.e. circuits, cells or patterns) of the design and more specifically, the clips typically represent small portions for which particular attention and/or verification is needed. In other words, clips may be the portions of the design layout, or may be similar or have a similar behavior of portions of the design layout, where one or more critical features are identified either by experience (including clips provided by a customer), by trial and error, or by running a full-chip simulation. Clips may contain one or more test patterns or gauge patterns.

An initial larger set of clips may be provided a priori by a customer based on one or more known critical feature areas in a design layout which require particular image optimization. Alternatively, in another embodiment, an initial larger set of clips may be extracted from the entire design layout by using some kind of automated (such as machine vision) or manual algorithm that identifies the one or more critical feature areas.

In a lithographic projection apparatus, as an example, a cost function may be expressed as $$CF(z_1,z_2,\ldots,z_N)=\sum_{p=1}^{P} w_p f_p^2(z_1,z_2,\ldots,z_N) \quad \text{(Eq. 1)}$$

wherein $(z_1, z_2, \ldots, z_N)$ are N design variables or values thereof. $f_p(z_1, z_2, \ldots, z_N)$ can be a function of the design variables $(z_1, z_2, \ldots, z_N)$ such as a difference between an actual value and an intended value of a characteristic for a set of values of the design variables of $(z_1, z_2, \ldots, z_N)$. $w_p$ is a weight constant associated with $f_p(z_1, z_2, \ldots, z_N)$. For example, the characteristic may be a position of an edge of a pattern, measured at a given point on the edge. Different $f_p(z_1, z_2, \ldots, z_N)$ may have different weight $w_p$. For example, if a particular edge has a narrow range of permitted positions, the weight $w_p$ for the $f_p(z_1, z_2, \ldots, z_N)$ representing the difference between the actual position and the intended position of the edge may be given a higher value. $f_p(z_1, z_2, \ldots, z_N)$ can also be a function of an interlayer characteristic, which is in turn a function of the design variables $(z_1, z_2, \ldots, z_N)$. Of course, $CF(z_1, z_2, \ldots, z_N)$ is not limited to the form in Eq. 1. $CF(z_1, z_2, \ldots, z_N)$ can be in any other suitable form.

The cost function may represent any one or more suitable characteristics of the lithographic projection apparatus, lithographic process or the substrate, for instance, focus, CD, image shift, image distortion, image rotation, stochastic variation, throughput, local CD variation, process window, an interlayer characteristic, or a combination thereof. In one embodiment, the design variables $(z_1, z_2, \ldots, z_N)$ comprise one or more selected from dose, global bias of the patterning device, and/or shape of illumination. Since it is the resist image that often dictates the pattern on a substrate, the cost function may include a function that represents one or more characteristics of the resist image. For example, $f_p(z_1, z_2, \ldots, z_N)$ can be simply a distance between a point in the resist image to an intended position of that point (i.e., edge placement error $EPE_p(z_1, z_2, \ldots, z_N)$). The design variables can include any adjustable parameter such as an adjustable parameter of the source, the patterning device, the projection optics, dose, focus, etc.

The lithographic apparatus may include components collectively called a "wavefront manipulator" that can be used to adjust the shape of a wavefront and intensity distribution and/or phase shift of a radiation beam. In an embodiment, the lithographic apparatus can adjust a wavefront and intensity distribution at any location along an optical path of the lithographic projection apparatus, such as before the patterning device, near a pupil plane, near an image plane, and/or near a focal plane. The wavefront manipulator can be used to correct or compensate for certain distortions of the wavefront and intensity distribution and/or phase shift caused by, for example, the source, the patterning device, temperature variation in the lithographic projection apparatus, thermal expansion of components of the lithographic projection apparatus, etc. Adjusting the wavefront and intensity distribution and/or phase shift can change values of the characteristics represented by the cost function. Such changes can be simulated from a model or actually measured. The design variables can include parameters of the wavefront manipulator.

The design variables may have constraints, which can be expressed as $(z_1, z_2, \ldots, z_N) \in Z$, where Z is a set of possible values of the design variables. One possible constraint on the design variables may be imposed by a desired throughput of the lithographic projection apparatus. Without such a constraint imposed by the desired throughput, the optimization may yield a set of values of the design variables that are unrealistic. For example, if the dose is a design variable, without such a constraint, the optimization may yield a dose value that makes the throughput economically impossible. However, the usefulness of constraints should not be interpreted as a necessity. For example, the throughput may be affected by the pupil fill ratio. For some illumination designs, a low pupil fill ratio may discard radiation, leading to lower throughput. Throughput may also be affected by the resist chemistry. Slower resist (e.g., a resist that requires higher amount of radiation to be properly exposed) leads to lower throughput.

At least one of the characteristics represented by the $f_p(z_1, z_2, \ldots, z_N)$ in the cost function can be an interlayer characteristic, according to an embodiment. Namely, the $f_p(z_1, z_2, \ldots, z_N)$ can be a function of the interlayer characteristic, which is in turn a function of the design variables $(z_1, z_2, \ldots, z_N)$.

A device may include structures distributed in multiple layers on a substrate. The multiple layers are at different distances from the substrate. An interlayer characteristic is a characteristic of a structure relative to another structure when these structures are in different layers. An interlayer characteristic may have significant technical implications. For example, a contact in one layer designed to connect to a via in another layer must be within a prescribed distance to the via in order to avoid a defect. For example, to reduce parasitic capacitance between two interconnects at different layers, their overlap area should not be too large. For example, in a MOSFET, the gate should not be too far off from the position over a channel between the source and drain positioned in a layer below the gate. The interlayer characteristic is not limited to geometric characteristics. For example, the interlayer characteristic may be a difference in dielectric constants between two structures in different layers.

Figure 3A:
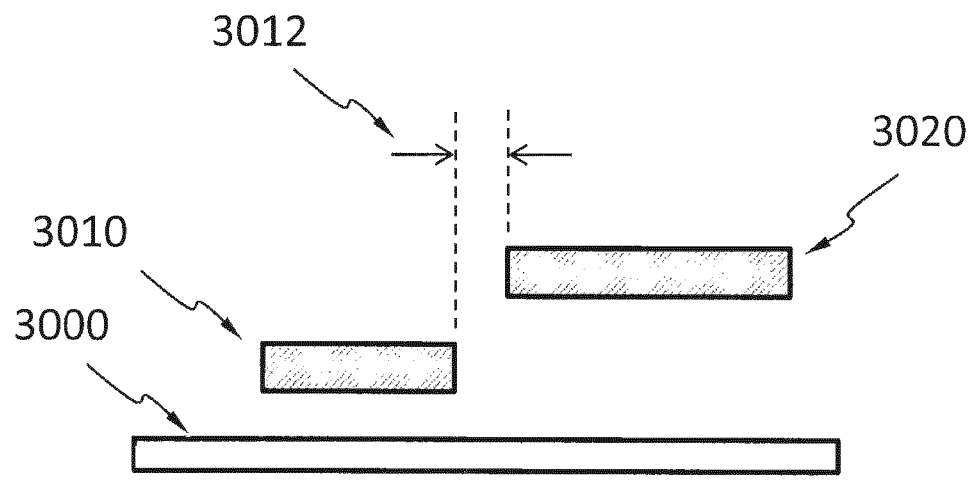
FIG. 3A and FIG. 3B schematically show an interlayer characteristic, according to an embodiment.
Figure 3B:
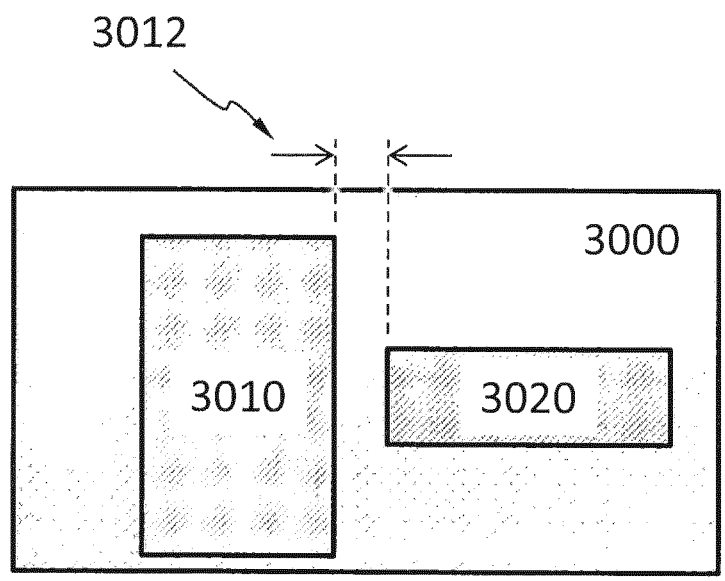

FIG. 3A and FIG. 3B schematically show an interlayer characteristic 3012 that is a distance between an edge of a pattern 3010 and an edge of a pattern 3020 in a direction parallel to a substrate 3000. The patterns 3010 and 3020 are in different layers on the substrate 3000. The edge of the pattern 3010 faces the edge of the pattern 3020. The patterns 3010 and 3020 do not overlap. FIG. 3A is a cross-sectional view. FIG. 3B is a top view. The patterns 3010 may be a structure etched into the substrate. The pattern 3020 may be a pattern in an aerial image, a resist image, or an etched image. The pattern 3020 may be a structure formed by implantation, etching or deposition. The pattern 3010 or the pattern 3020 may be simulated. The interlayer characteristic 3012 thus may be a distance between an edge of a structure etched into the substrate and an edge of a pattern in an aerial image, a resist image, or an etched image. The interlayer characteristic 3012 may be simulated by simulating one or both of pattern 3010 and the pattern 3020.

Figure 4A:
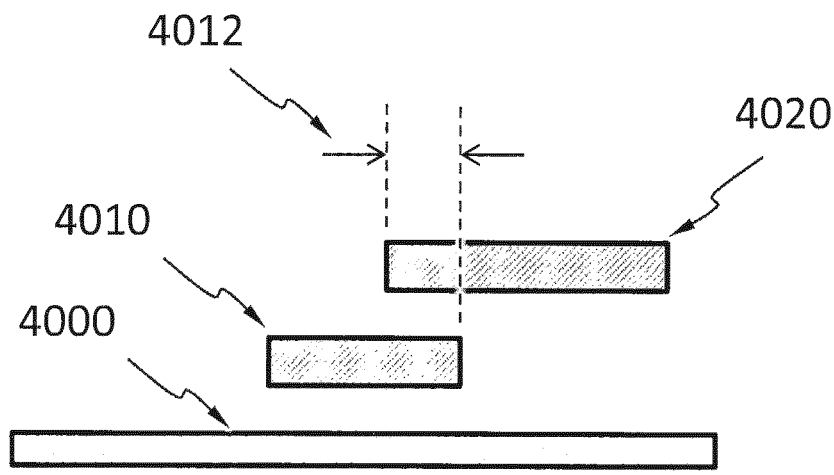
FIG. 4A, FIG. 4B and FIG. 4C schematically show an interlayer characteristic, according to an embodiment.
Figure 4B:
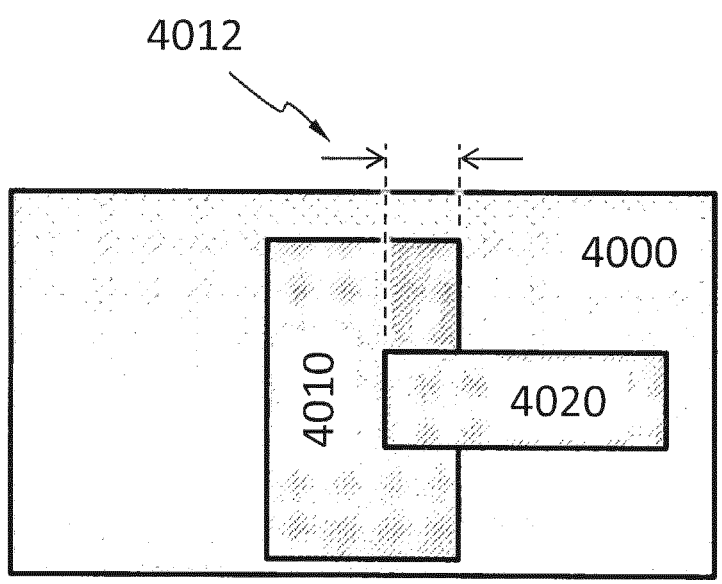
Figure 4C:
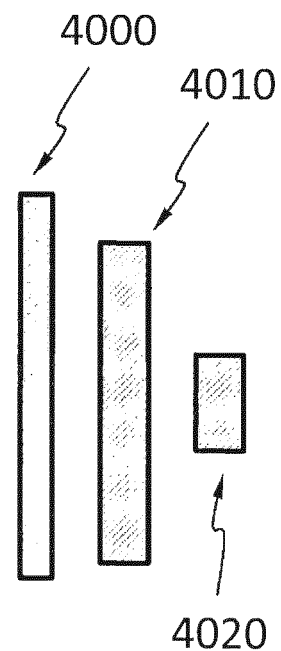

FIG. 4A, FIG. 4B and FIG. 4C schematically show an interlayer characteristic 4012 that is a distance between an edge of a pattern 4010 and an edge of a pattern 4020 in a direction parallel to a substrate 4000. The patterns 4010 and 4020 are in different layers on the substrate 4000. The patterns 4010 and 4020 overlap. FIG. 4A is a cross-sectional view. FIG. 4B is a top view. FIG. 4C is another cross-sectional view. The patterns 4010 may be a structure etched into the substrate. The pattern 4020 may be a pattern in an aerial image, a resist image, or an etched image. The pattern 4020 may be a structure formed by implantation, etching or deposition. The pattern 4010 or the pattern 4020 may be simulated. The interlayer characteristic 4012 thus may be a distance between an edge of a structure etched into the substrate and an edge of a pattern in an aerial image, a resist image, or an etched image. The interlayer characteristic 4012 may be simulated by simulating one or both of pattern 4010 and the pattern 4020.

Figure 5A:
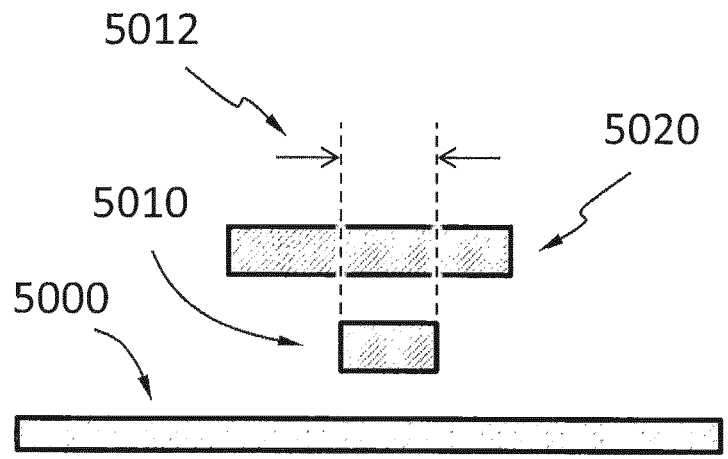
FIG. 5A, FIG. 5B and FIG. 5C schematically show an interlayer characteristic, according to an embodiment.
Figure 5B:
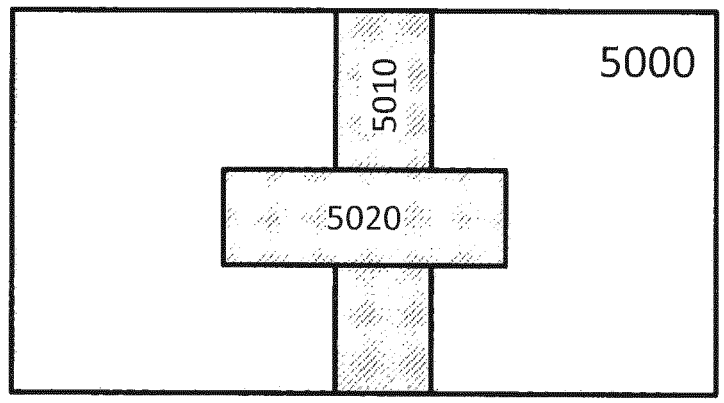
Figure 5C:
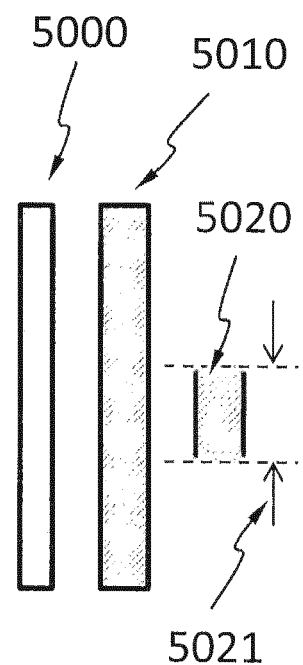

FIG. 5A, FIG. 5B and FIG. 5C schematically show an interlayer characteristic that is an overlapping area between a pattern 5010 and a pattern 5020. The patterns 5010 and 5020 are in different layers on a substrate 5000. The overlapping area may be a product of a width 5021 of the part of the pattern 5020 overlapping with the pattern 5010, and a width 5012 of the part of the pattern 5010 overlapping with the pattern 5020. FIG. 5A is a cross-sectional view. FIG. 5B is a top view. FIG. 5C is another cross-sectional view. The patterns 6010 may be a structure etched into the substrate. The pattern 5020 may be a pattern in an aerial image, a resist image, or an etched image. The pattern 5020 may be a structure formed by implantation, etching or deposition. The pattern 5010 or the pattern 5020 may be simulated. The overlapping area as the interlayer characteristic thus may be an overlapping area between a structure etched into the substrate and a pattern in an aerial image, a resist image, or an etched image. The overlapping area as the interlayer characteristic may be simulated by simulating one or both of pattern 5010 and the pattern 5020.

Figure 6A:
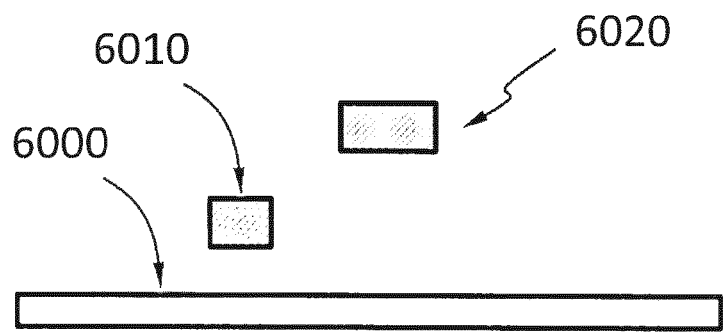
FIG. 6A, FIG. 6B and FIG. 6C schematically show an interlayer characteristic, according to an embodiment.
Figure 6B:
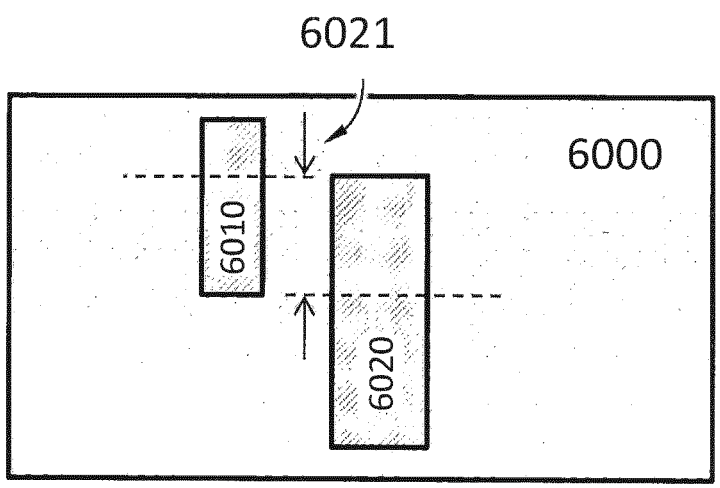
Figure 6C:
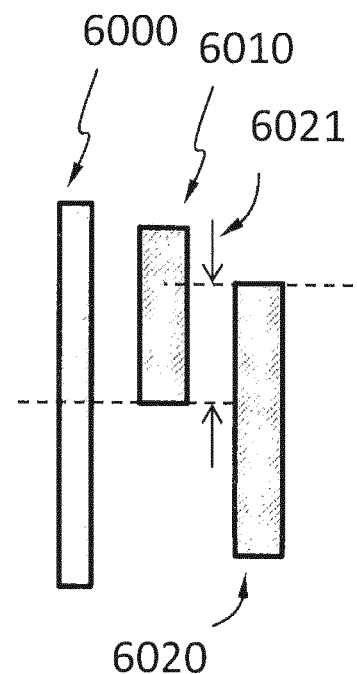

FIG. 6A, FIG. 6B and FIG. 6C schematically show an interlayer characteristic 6012 that is a distance between an edge of a pattern 6010 and an edge of a pattern 6020 in a direction parallel to a substrate 6000. The edge of the pattern 6010 does not face the edge of the pattern 6020. The patterns 6010 and 6020 are in different layers on the substrate 6000. The patterns 6010 and 6020 do not overlap. FIG. 6A is a cross-sectional view. FIG. 6B is a top view. FIG. 6C is another cross-sectional view. The pattern 6010 or pattern 6020 may be a structure etched into the substrate. The pattern 6010 or pattern 6020 may be patterns in an aerial image, a resist image, or an etched image. The pattern 6010 or pattern 6020 may be structures formed by implantation, etching or deposition. The pattern 6010 or pattern 6020 may be simulated. The interlayer characteristic 6012 thus may be a distance between an edge of a structure etched into the substrate and an edge of a pattern in an aerial image, a resist image, or an etched image. The interlayer characteristic 6012 may be simulated by simulating one or both of pattern 6010 and the pattern 6020.

The optimization process therefore is to find a set of values of the one or more design variables, under the constraints $(z_1, z_2, \ldots, z_N) \in Z$, that optimize the cost function, e.g., to find:

$$(\tilde{z}_1, \tilde{z}_2, \ldots, \tilde{z}_N) = \arg\min_{(z_1, z_2, \ldots, z_N) \in Z} CF(z_1, z_2, \ldots, z_N) \quad \text{(Eq. 2)}$$

Figure 7:
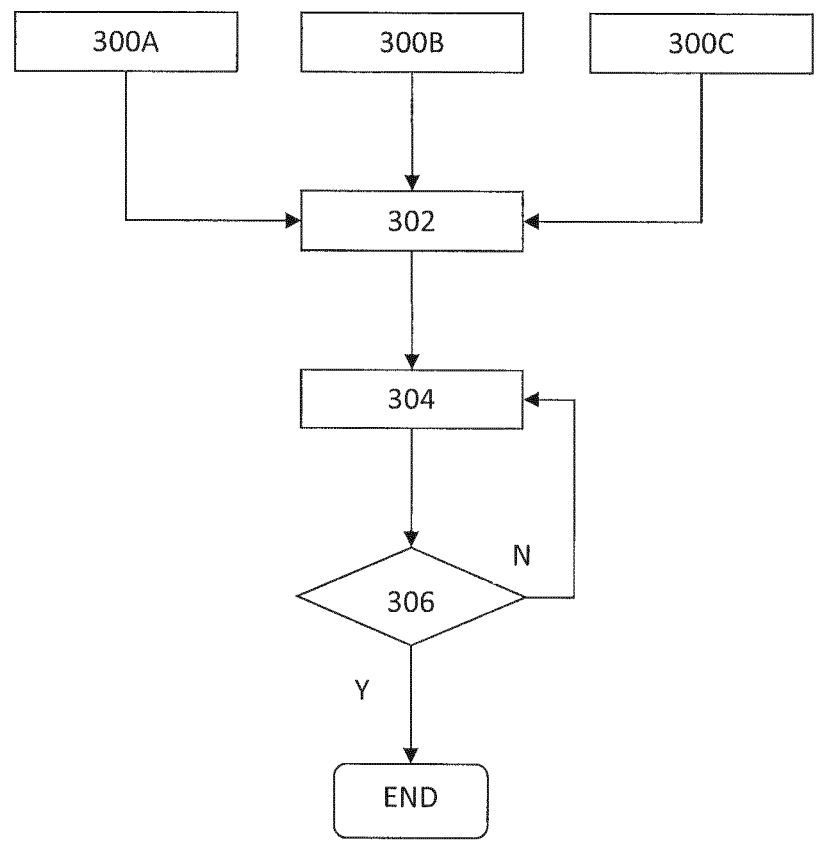
FIG. 7 is a flow diagram illustrating aspects of an example methodology of joint optimization/co-optimization.

A general method of optimizing, according to an embodiment, is illustrated in FIG. 7. This method comprises a step 302 of defining a multi-variable cost function of a plurality of design variables. The design variables may comprise any suitable combination selected from design variables representing one or more characteristics of the illumination (300A) (e.g., pupil fill ratio, namely percentage of radiation of the illumination that passes through a pupil or aperture), one or more characteristics of the projection optics (300B) and/or one or more characteristics of the design layout (300C). For example, the design variables may include design variables representing one or more characteristics of the illumination (300A) and of the design layout (300C) (e.g., global bias) but not of one or more characteristics of the projection optics (300B), which leads to an illumination-patterning device (e.g., mask) optimization ("source-mask optimization" or SMO). Or, the design variables may include design variables representing one or more characteristics of the illumination (300A) (optionally polarization), of the projection optics (300B) and of the design layout (300C), which leads to an illumination-patterning device (e.g., mask)-projection system (e.g., lens) optimization ("source-mask-lens optimization" or SMLO). In step 304, the design variables are simultaneously adjusted so that the cost function is moved towards convergence. In step 306, it is determined whether a predefined termination condition is satisfied. The predetermined termination condition may include various possibilities, e.g., one or more selected from: the cost function is minimized or maximized, as required by the numerical technique used, the value of the cost function is equal to a threshold value or crosses the threshold value, the value of the cost function reaches within a preset error limit, and/or a preset number of iterations is reached. If a condition in step 306 is satisfied, the method ends. If the one or more conditions in step 306 is not satisfied, the steps 304 and 306 are iteratively repeated until a desired result is obtained. The optimization does not necessarily lead to a single set of values for the one or more design variables because there may be a physical restraint, caused by a factor such as pupil fill factor, resist chemistry, throughput, etc. The optimization may provide multiple sets of values for the one or more design variables and associated performance characteristics (e.g., the throughput) and allows a user of the lithographic apparatus to pick one or more sets.

The illumination, patterning device and projection optics can be optimized alternately (referred to as Alternate Optimization) or optimized simultaneously (referred to as Simultaneous Optimization). Patterns on multiple layers of the design layout may be optimized simultaneously or alternately. For example, in the example of FIG. 3A and FIG. 3B, if neither of the patterns 3010 and 3020 are not actually formed on the substrate 3000, their designs are may still be refined and thus can both be optimized. Patterns on a layer of the multiple layers may be excluded from the optimization. For example, if the pattern 3010 is already physically formed on the substrate, it is not meaningful to optimize the design of the pattern 3010. The terms "simultaneous", "simultaneously", "joint" and "jointly" as used herein mean that the one or more design variables representing one or more characteristics of the illumination, patterning device, projection optics and/or any other design variable, are allowed to change at the same time. The term "alternate" and "alternately" as used herein mean that not all of the design variables are allowed to change at the same time.

Figure 8:
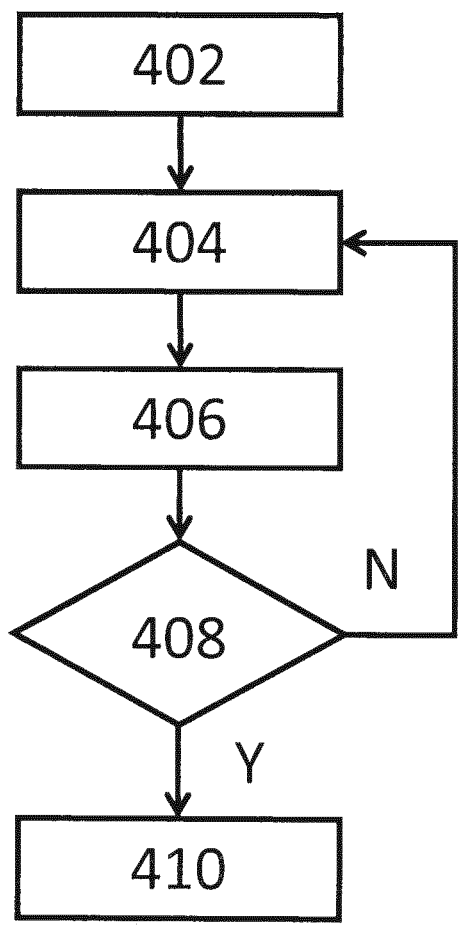
FIG. 8 shows an embodiment of a further optimization method, according to an embodiment.

In FIG. 7, the optimization of all the design variables is executed simultaneously. Such a flow may be called simultaneous flow or co-optimization flow. Alternately, the optimization of all the design variables is executed alternately, as illustrated in FIG. 8. In this flow, in each step, some design variables are fixed while other design variables are optimized to optimize the cost function; then in the next step, a different set of variables are fixed while the others are optimized to minimize or maximize the cost function. These steps are executed alternately until convergence or a certain terminating condition is met. As shown in the non-limiting example flowchart of FIG. 8, first, a design layout (step 402) is obtained, then a step of illumination optimization is executed in step 404, where the one or more design variables of the illumination are optimized (SO) to minimize or maximize the cost function while other design variables are fixed. Then in the next step 406, a patterning device (e.g., mask) optimization (MO) is performed, where the design variables of the patterning device are optimized to minimize or maximize the cost function while other design variables are fixed. These two steps are executed alternately, until a certain terminating condition is met in step 408. One or more various termination conditions can be used, such as the value of the cost function becomes equal to a threshold value, the value of the cost function crosses the threshold value, the value of the cost function reaches within a preset error limit, a preset number of iterations is reached, etc. Note that SO-MO-Alternative-Optimization is used as an example for the alternative flow. The alternative flow can take many different forms, such as SO-LO-MO-Alternative-Optimization, where SO, LO (projection optics optimization) is executed, and MO alternately and iteratively; or first SMO can be executed once, then execute LO and MO alternately and iteratively; and so on. Another alternative is SO-PO-MO (illumination optimization, polarization optimization and patterning device optimization) Finally the output of the optimization result is obtained in step 410, and the process stops.

The pattern selection algorithm, as discussed before, may be integrated with the simultaneous or alternative optimization. For example, when an alternative optimization is adopted, first a full-chip SO can be performed, one or more 'hot spots' and/or 'warm spots' are identified, then a MO is performed. In view of the present disclosure numerous permutations and combinations of sub-optimizations are possible in order to achieve the desired optimization results.

Figure 9A:
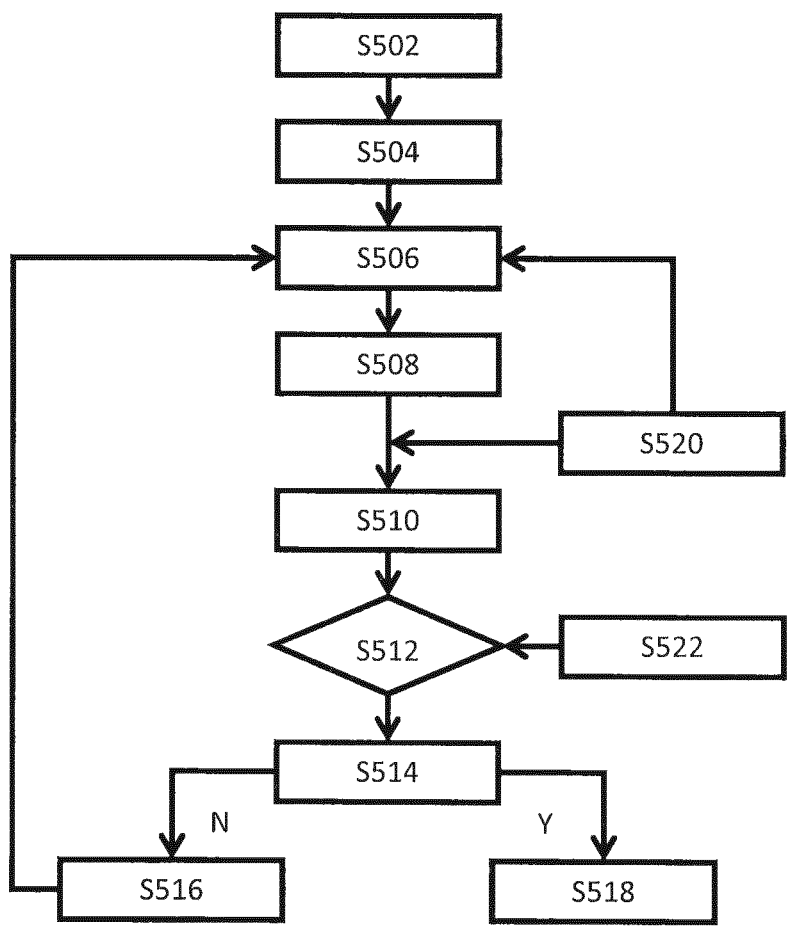
FIG. 9A, FIG. 9B and FIG. 10 show example flowcharts of various optimization processes.

FIG. 9A shows one exemplary method of optimization, where a cost function representing one or more characteristics of the lithographic process is minimized or maximized. In step S502, initial values of one or more design variables are obtained, including one or more associated tuning ranges, if any. In step S504, the multi-variable cost function is set up. In step S506, the cost function is expanded within a small enough neighborhood around the starting point value of the one or more design variables for the first iterative step (i=0). In step S508, standard multi-variable optimization techniques are applied to the cost function. Note that the optimization problem can apply constraints, such as the one or more tuning ranges, during the optimization process in S508 or at a later stage in the optimization process. Step S520 indicates that each iteration is done for the one or more given test patterns (also known as "gauges") for the characteristics the cost function represents. In step S510, a lithographic response is predicted. In step S512, the result of step S510 is compared with a desired or ideal lithographic response value obtained in step S522. If the termination condition is satisfied in step S514, i.e. the optimization generates a lithographic response value sufficiently close to the desired value, then the final value of the design variables is outputted in step S518. The output step may also include outputting one or more other functions using the final values of the design variables, such as outputting a wavefront aberration-adjusted map at the pupil plane (or other planes), an optimized illumination map, and/or optimized design layout etc. If the termination condition is not satisfied, then in step S516, the values of the one or more design variables is updated with the result of the i-th iteration, and the process goes back to step S506. The process of FIG. 9A is elaborated in details below.

In an exemplary optimization process, no relationship between the design variables $(z_1, z_2, \ldots, z_N)$ and $f_p(z_1, z_2, \ldots, z_N)$ is assumed or approximated, except that $f_p(z_1, z_2, \ldots, z_N)$ is sufficiently smooth (e.g. first order derivatives $$\frac{\partial f_p(z_1, z_2, \cdots, z_N)}{\partial z_n},$$

(n=1,2, ... N) exist), which is generally valid in a lithographic projection apparatus. An algorithm, such as the Gauss-Newton algorithm, the Levenberg-Marquardt algorithm, the Broyden-Fletcher-Goldfarb-Shanno algorithm, the gradient descent algorithm, the simulated annealing algorithm, the interior point algorithm, and the genetic algorithm, can be applied to find $(\tilde{z}_1, \tilde{z}_2, \ldots, \tilde{z}_N)$.

Here, the Gauss-Newton algorithm is used as an example. The Gauss-Newton algorithm is an iterative method applicable to a general non-linear multi-variable optimization problem. In the i-th iteration wherein the design variables $(z_1, z_2, \ldots, z_N)$ take values of $(z_{1i}, z_{2i}, \ldots, z_{Ni})$, the Gauss-Newton algorithm linearizes $f_p(z_1, z_2, \ldots, z_N)$ in the vicinity of $(z_{1i}, z_{2i}, \ldots, z_{Ni})$, and then calculates values $(z_{1(i+1)}, z_{2(i+1)}, \ldots, z_{N(i+1)})$ in the vicinity of $(z_{1i}, z_{2i}, \ldots, z_{Ni})$ that give a minimum of $CF(z_1, z_2, \ldots, z_N)$. The design variables $(z_1, z_2, \ldots, z_N)$ take the values of $(z_{1(i+1)}, z_{2(i+1)}, \ldots, z_{N(i+1)})$ in the (i+1)-th iteration. This iteration continues until convergence (i.e. $CF(z_1, z_2, \ldots, z_N)$ does not reduce any further) or a preset number of iterations is reached.

Specifically, in the i-th iteration, in the vicinity of $(z_{1i}, z_{2i}, \ldots, z_{Ni})$, $$f_p(z_1, z_2, \cdots, z_N) \approx f_p(z_{1i}, z_{2i}, \cdots, z_{Ni}) + \sum_{n=1}^{N} \frac{\partial f_p(z_1, z_2, \cdots, z_N)}{\partial z_n}\bigg|_{z_1=z_{1i}, z_2=z_{2i}, \cdots z_N=z_{Ni}} (z_n = z_{ni}) \quad \text{(Eq. 3)}$$

Under the approximation of Eq. 3, the cost function becomes:

$$CF(z_1, z_2, \cdots, z_N) = \sum_{p=1}^{P} w_p f_p^2(z_1, z_2, \cdots, z_N) = \sum_{p=1}^{P} w_p \left( f_p(z_{1i}, z_{2i}, \cdots, z_{Ni}) + \sum_{n=1}^{N} \frac{\partial f_p(z_1, z_2, \cdots, z_N)}{\partial z_n}\bigg|_{z_1=z_{1i}, z_2=z_{2i}, \cdots z_N=z_{Ni}} (z_n = z_{ni}) \right)^2 \quad \text{(Eq. 4)}$$

which is a quadratic function of the design variables $(z_1, z_2, \ldots, z_N)$. Every term is constant except the design variables $(z_1, z_2, \ldots, z_N)$.

If the design variables $(z_1, z_2, \ldots, z_N)$ are not under any constraints, $(z_{1(i+1)}, z_{2(i+1)}, \ldots, z_{N(i+1)})$ can be derived by solving N linear equations:

$$\frac{\partial CF(z_1, z_2, \cdots, z_N)}{\partial z_n} = 0,$$

wherein n=1,2, ..., N.

If the design variables $(z_1, z_2, \ldots, z_N)$ are under constraints in the form of J inequalities (e.g. tuning ranges of $(z_1, z_2, \ldots, z_N)$) $\sum_{n=1}^{N} A_{nj} z_n \leq B_j$, for j=1, 2, ..., J; and K equalities (e.g. interdependence between the design variables) $\sum_{n=1}^{N} C_{nk} z_n \leq D_k$, for k=1,2, ..., K, the optimization process becomes a classic quadratic programming problem, wherein $A_{nj}, B_j, C_{nk}, D_k$ are constants. Additional constraints can be imposed for each iteration. For example, a "damping factor" $\Delta_D$, can be introduced to limit the difference between $(z_{1(i+1)}, z_{2(i+1)}, \ldots, z_{N(i+1)})$ and $(z_{1i}, z_{2i}, \ldots, z_{Ni})$, so that the approximation of Eq. 3 holds. Such constraints can be expressed as $z_{ni} - \Delta_D \leq z_n \leq z_{ni} + \Delta_D$. $(z_{1(i+1)}, z_{2(i+1)}, \ldots, z_{N(i+1)})$ can be derived using, for example, methods described in Numerical Optimization (2$^{nd}$ ed.) by Jorge Nocedal and Stephen J. Wright (Berlin New York: Vandenberghe. Cambridge University Press).

Instead of minimizing the RMS of $f_p(z_1, z_2, \ldots, z_N)$, the optimization process can minimize magnitude of the largest deviation (the worst defect) among the characteristics to their intended values. In this approach, the cost function can alternatively be expressed as $$CF(z_1, z_2, \cdots, z_N) = \max_{1 \leq p \leq P} \left( \frac{f_p(z_1, z_2, \cdots, z_N)}{CL_p} \right) \quad \text{(Eq. 5)}$$

wherein $CL_p$ is the maximum allowed value for $f_p(z_1, z_2, \ldots, z_N)$. This cost function represents the worst defect among the characteristics. Optimization using this cost function minimizes magnitude of the worst defect. An iterative greedy algorithm can be used for this optimization.

The cost function of Eq. 5 can be approximated as:

$$CF(z_1, z_2, \cdots, z_N) = \sum_{p=1}^{P} w_p \left( \frac{f_p(z_1, z_2, \cdots, z_N)}{CL_p} \right)^q \quad \text{(Eq. 6)}$$

wherein q is an even positive integer such as at least 4, or at least 10. Eq. 6 mimics the behavior of Eq. 5, while allowing the optimization to be executed analytically and accelerated by using methods such as the deepest descent method, the conjugate gradient method, etc.

Minimizing the worst defect size can also be combined with linearizing of $f_p(z_1, z_2, \ldots, z_N)$. Specifically, $f_p(z_1,$ $z_2, \ldots, z_N$) is approximated as in Eq. 3. Then the constraints on worst defect size are written as inequalities $E_{Lp} \leq f_p(z_1, z_2, \ldots, z_N) \leq E_{Up}$, wherein $E_{Lp}$ and $E_{Up}$, are two constants specifying the minimum and maximum allowed deviation for the $f_p(z_1, z_2, \ldots, z_N)$. Plugging Eq. 3 in, these constraints are transformed to, for p=1, ... P, $$\sum_{n=1}^{N} \frac{\partial f_p(z_1, z_2, \cdots, z_N)}{\partial z_n}\bigg|_{z_1=z_{1i}, z_2=z_{2i}, \cdots z_N=z_{Ni}} \qquad (\text{Eq. 6}')$$
$$z_n \leq E_{Up} + \sum_{n=1}^{N} \frac{\partial f_p(z_1, z_2, \cdots, z_N)}{\partial z_n}\bigg|_{z_1=z_{1i}, z_2=z_{2i}, \cdots z_N=z_{Ni}}$$
$$z_{ni} - f_p(z_{1i}, z_{2i}, \cdots, z_{Ni})$$

and $$-\sum_{n=1}^{N} \frac{\partial f_p(z_1, z_2, \cdots, z_N)}{\partial z_n}\bigg|_{z_1=z_{1i}, z_2=z_{2i}, \cdots z_N=z_{Ni}} \qquad (\text{Eq. 6}'')$$
$$z_n \leq -E_{Up} - \sum_{n=1}^{N} \frac{\partial f_p(z_1, z_2, \cdots, z_N)}{\partial z_n}\bigg|_{z_1=z_{1i}, z_2=z_{2i}, \cdots z_N=z_{Ni}}$$
$$z_{ni} + f_p(z_{1i}, z_{2i}, \cdots, z_{Ni})$$

Since Eq. 3 is generally valid only in the vicinity of ($z_1$, $z_2$, ..., $z_N$), in case the desired constraints $E_{Lp} \leq f_p(z_1, z_2, \ldots, z_N) \leq E_{Up}$ cannot be achieved in such vicinity, which can be determined by any conflict among the inequalities, the constants $E_{Lp}$ and $E_{Up}$ can be relaxed until the constraints are achievable. This optimization process minimizes the worst defect size in the vicinity of ($z_1, z_2, \ldots, z_N$), i. Then each step reduces the worst defect size gradually, and each step is executed iteratively until certain terminating conditions are met. This will lead to optimal reduction of the worst defect size.

Another way to minimize the worst defect is to adjust the weight $w_p$ in each iteration. For example, after the i-th iteration, if the r-th characteristic is the worst defect, $w_r$ can be increased in the (i+1)-th iteration so that the reduction of that characteristic's defect size is given higher priority.

In addition, the cost functions in Eq. 4 and Eq. 5 can be modified by introducing a Lagrange multiplier to achieve compromise between the optimization on RMS of the defect size and the optimization on the worst defect size, i.e., $$CF(z_1, z_2, \cdots, z_N) = (1-\lambda)\sum_{p=1}^{P} w_p f_p^2(z_1, z_2, \cdots, z_N) + \qquad (\text{Eq. 6}''')$$
$$\lambda \max_{1 \leq p \leq P} \frac{f_p(z_1, z_2, \cdots, z_N)}{CL_p}$$

where λ is a preset constant that specifies the trade-off between the optimization on RMS of the defect size and the optimization on the worst defect size. In particular, if λ=0, then this becomes Eq. 4 and the RMS of the defect size is only minimized; while if λ=1, then this becomes Eq. 5 and the worst defect size is only minimized; if 0<λ<1, then both are taken into consideration in the optimization. Such optimization can be solved using multiple methods. For example, the weighting in each iteration may be adjusted, similar to the one described previously. Alternatively, similar to minimizing the worst defect size from inequalities, the inequalities of Eq. 6' and 6" can be viewed as constraints of the design variables during solution of the quadratic programming problem. Then, the bounds on the worst defect size can be relaxed incrementally or increase the weight for the worst defect size incrementally, compute the cost function value for every achievable worst defect size, and choose the design variable values that minimize the total cost function as the initial point for the next step. By doing this iteratively, the minimization of this new cost function can be achieved.

Optimizing a lithographic projection apparatus can expand the process window. A larger process window provides more flexibility in process design and chip design. The process window can be defined as, for example, a set of focus and dose values for which the resist image is within a certain limit of the design target of the resist image. Note that all the methods discussed here may also be extended to a generalized process window definition that can be established by different or additional base parameters than exposure dose and defocus. These may include, but are not limited to, optical settings such as NA, sigma, aberration, polarization, or an optical constant of the resist layer. For example, as described earlier, if the process window (PW) also comprises different patterning device pattern bias (mask bias), then the optimization includes the minimization of Mask Error Enhancement Factor (MEEF), which is defined as the ratio between the substrate edge placement error (EPE) and the induced patterning device pattern edge bias. The process window defined on focus and dose values only serve as an example in this disclosure.

A method of maximizing a process window using, for example, dose and focus as its parameters, according to an embodiment, is described below. In a first step, starting from a known condition ($f_0, \varepsilon_0$) in the process window, wherein $f_0$ is a nominal focus and $\varepsilon_0$ is a nominal dose, minimizing one of the cost functions below in the vicinity ($f_0 \pm \Delta f, \varepsilon_0 \pm \varepsilon$):

$$CF(z_1, z_2, \ldots, z_N, f_0, \varepsilon_0) = \max_{(f, \varepsilon)=(f_0 \pm \Delta f, \varepsilon_0 \pm \varepsilon)} \max_p |f_p(z_1, z_2, \ldots, z_N, f, \varepsilon)| \qquad (\text{Eq. 7})$$

or $$CF(z_1, z_2, \ldots, z_N, f_0, \varepsilon_0) = \sum_{(f, \varepsilon)=(f_0 \pm \Delta f, \varepsilon_0 \pm \varepsilon)} \sum_p w_p f_p^2(z_1, z_2, \ldots, z_N, f, \varepsilon) \qquad (\text{Eq. 7}')$$

or $$CF(z_1, z_2, \ldots, z_N, f_0, \varepsilon_0) = (1-\lambda)\sum_{(f, \varepsilon)=(f_0 \pm \Delta f, \varepsilon_0 \pm \varepsilon)} \sum_p w_p f_p^2 (z_1, z_2, \ldots, z_N, f, \varepsilon) + \lambda \max_{(f, \varepsilon)=(f_0 \pm \Delta f, \varepsilon_0 \pm \varepsilon)} \max_p |f_p(z_1, z_2, \ldots, z_N, f, \varepsilon)| \qquad (\text{Eq. 7}'')$$

If the nominal focus $f_0$ and nominal dose $\varepsilon_0$ are allowed to shift, they can be optimized jointly with the design variables ($z_1, z_2, \ldots, z_N$). In the next step, ($f_0 \pm \Delta f, \varepsilon_0 \pm \varepsilon$) is accepted as part of the process window, if a set of values of ($z_1, z_2, \ldots, z_N, f, E$) can be found such that the cost function is within a preset limit.

If the focus and dose are not allowed to shift, the design variables ($z_1, z_2, \ldots, z_N$) are optimized with the focus and dose fixed at the nominal focus $f_0$ and nominal dose $\varepsilon_0$. In an alternative embodiment, ($f_0 \pm \Delta f, \varepsilon_0 \pm \varepsilon$) is accepted as part of the process window, if a set of values of ($z_1, z_2, \ldots, z_N$) can be found such that the cost function is within a preset limit.

The methods described earlier in this disclosure can be used to minimize the respective cost functions of Eqs. 7, 7', or 7". If the design variables represent one or more characteristics of the projection optics, such as the Zernike coefficients, then minimizing the cost functions of Eqs. 7, 7', or 7" leads to process window maximization based on projection optics optimization, i.e., LO. If the design variables represent one or more characteristics of the illumination and patterning device in addition to those of the projection optics, then minimizing the cost function of Eqs. 7, 7', or 7" leads to process window maximizing based on SMLO, as illustrated in FIG. 7. If the design variables represented one or more characteristics of the source and patterning device, then minimizing the cost functions of Eqs. 7, 7', or 7" leads to process window maximization based on SMO. The cost functions of Eqs. 7, 7', or 7" can also include at least one $f_p$ $(z_1, z_2, \ldots, z_N)$ such as described herein, that is a function of the bandwidth.

Figure 10:
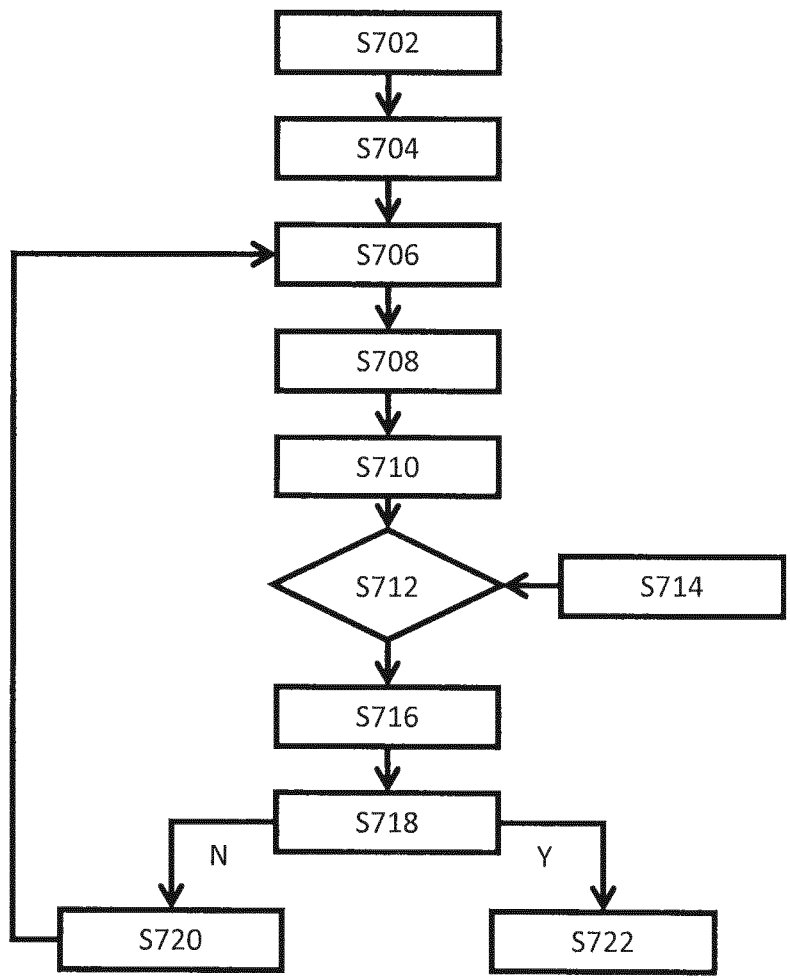

FIG. 10 shows one specific example of how a simultaneous SMLO process can use a Gauss Newton Algorithm for optimization. In step S702, starting values of one or more design variables are identified. A tuning range for each variable may also be identified. In step S704, the cost function is defined using the one or more design variables. In step S706, the cost function is expanded around the starting values of the design variables. In step S708, a suitable optimization technique is applied to minimize or maximize the cost function. In optional step S710, a full-chip simulation is executed to cover all critical patterns in a full-chip design layout. A desired lithographic response metric (such as CD or EPE) is obtained in step S714, and compared with predicted values of those quantities in step S712. In step S716, a process window is determined. Steps S718, S720, and S722 are similar to corresponding steps S514, S516 and S518, as described with respect to FIG. 9A. As mentioned before, the final output may be, for example, a wavefront aberration map in the pupil plane, optimized to produce the desired imaging performance. The final output may be, for example, an optimized illumination map and/or an optimized design layout.

Figure 9B:
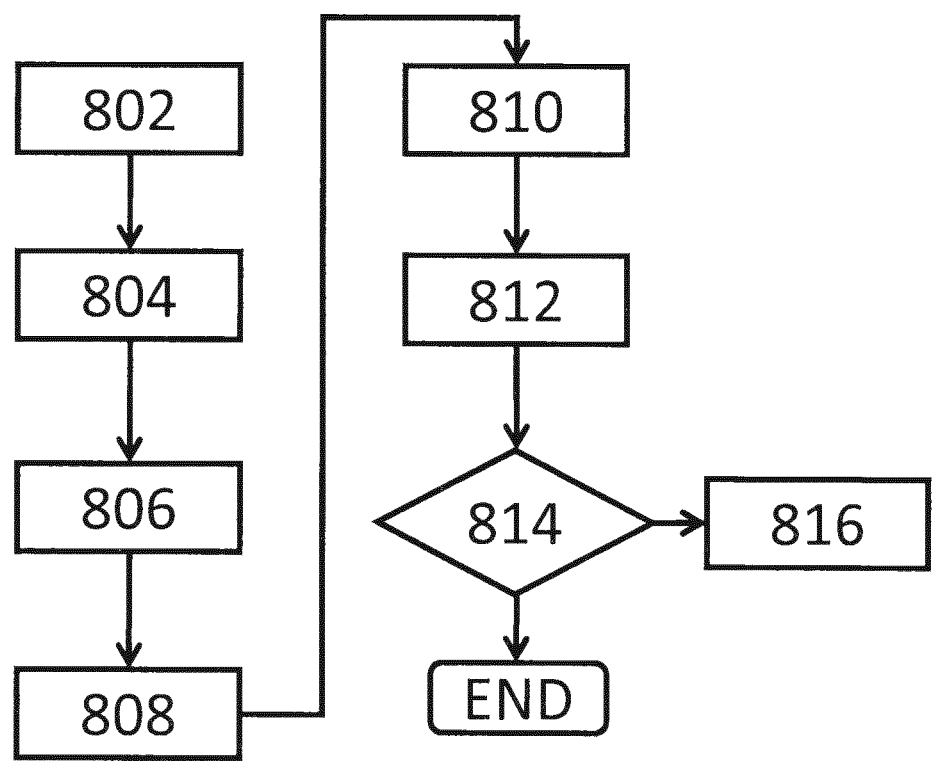

FIG. 9B shows an exemplary method to optimize the cost function where the design variables $(z_1, z_2, \ldots, z_N)$ include design variables that may only assume discrete values.

The method starts by defining the pixel groups of the illumination and the patterning device tiles of the patterning device (step 802). Generally, a pixel group or a patterning device tile may also be referred to as a division of a lithographic process component. In one exemplary approach, the illumination is divided into 117 pixel groups, and 94 patterning device tiles are defined for the patterning device, substantially as described above, resulting in a total of 211 divisions.

In step 804, a lithographic model is selected as the basis for lithographic simulation. A lithographic simulation produces results that are used in calculations of one or more lithographic metrics, or responses. A particular lithographic metric is defined to be the performance metric that is to be optimized (step 806). In step 808, the initial (pre-optimization) conditions for the illumination and the patterning device are set up. Initial conditions include initial states for the pixel groups of the illumination and the patterning device tiles of the patterning device such that references may be made to an initial illumination shape and an initial patterning device pattern. Initial conditions may also include patterning device pattern bias (sometimes referred to as mask bias), NA, and/or focus ramp range. Although steps 802, 804, 806, and 808 are depicted as sequential steps, it will be appreciated that in other embodiments, these steps may be performed in other sequences.

In step 810, the pixel groups and patterning device tiles are ranked. Pixel groups and patterning device tiles may be interleaved in the ranking Various ways of ranking may be employed, including: sequentially (e.g., from pixel group 1 to pixel group 117 and from patterning device tile 1 to patterning device tile 94), randomly, according to the physical locations of the pixel groups and patterning device tiles (e g, ranking pixel groups closer to the center of the illumination higher), and/or according to how an alteration of the pixel group or patterning device tile affects the performance metric.

Once the pixel groups and patterning device tiles are ranked, the illumination and patterning device are adjusted to improve the performance metric (step 812). In step 812, each of the pixel groups and patterning device tiles are analyzed, in order of ranking, to determine whether an alteration of the pixel group or patterning device tile will result in an improved performance metric. If it is determined that the performance metric will be improved, then the pixel group or patterning device tile is accordingly altered, and the resulting improved performance metric and modified illumination shape or modified patterning device pattern form the baseline for comparison for subsequent analyses of lower-ranked pixel groups and patterning device tiles. In other words, alterations that improve the performance metric are retained. As alterations to the states of pixel groups and patterning device tiles are made and retained, the initial illumination shape and initial patterning device pattern changes accordingly, so that a modified illumination shape and a modified patterning device pattern result from the optimization process in step 812.

In other approaches, patterning device polygon shape adjustments and pairwise polling of pixel groups and/or patterning device tiles are also performed within the optimization process of 812.

In an embodiment, the interleaved simultaneous optimization procedure may include altering a pixel group of the illumination and if an improvement of the performance metric is found, the dose or intensity is stepped up and/or down to look for further improvement. In a further embodiment, the stepping up and/or down of the dose or intensity may be replaced by a bias change of the patterning device pattern to look for further improvement in the simultaneous optimization procedure.

In step 814, a determination is made as to whether the performance metric has converged. The performance metric may be considered to have converged, for example, if little or no improvement to the performance metric has been witnessed in the last several iterations of steps 810 and 812. If the performance metric has not converged, then the steps of 810 and 812 are repeated in the next iteration, where the modified illumination shape and modified patterning device from the current iteration are used as the initial illumination shape and initial patterning device for the next iteration (step 816).

The optimization methods described above may be used to increase the throughput of the lithographic projection apparatus. For example, the cost function may include a $f_p$ $(z_1, z_2, \ldots, z_N)$ that is a function of the exposure time. In an embodiment, optimization of such a cost function is constrained or influenced by a measure of the bandwidth or other metric.

Figure 11:
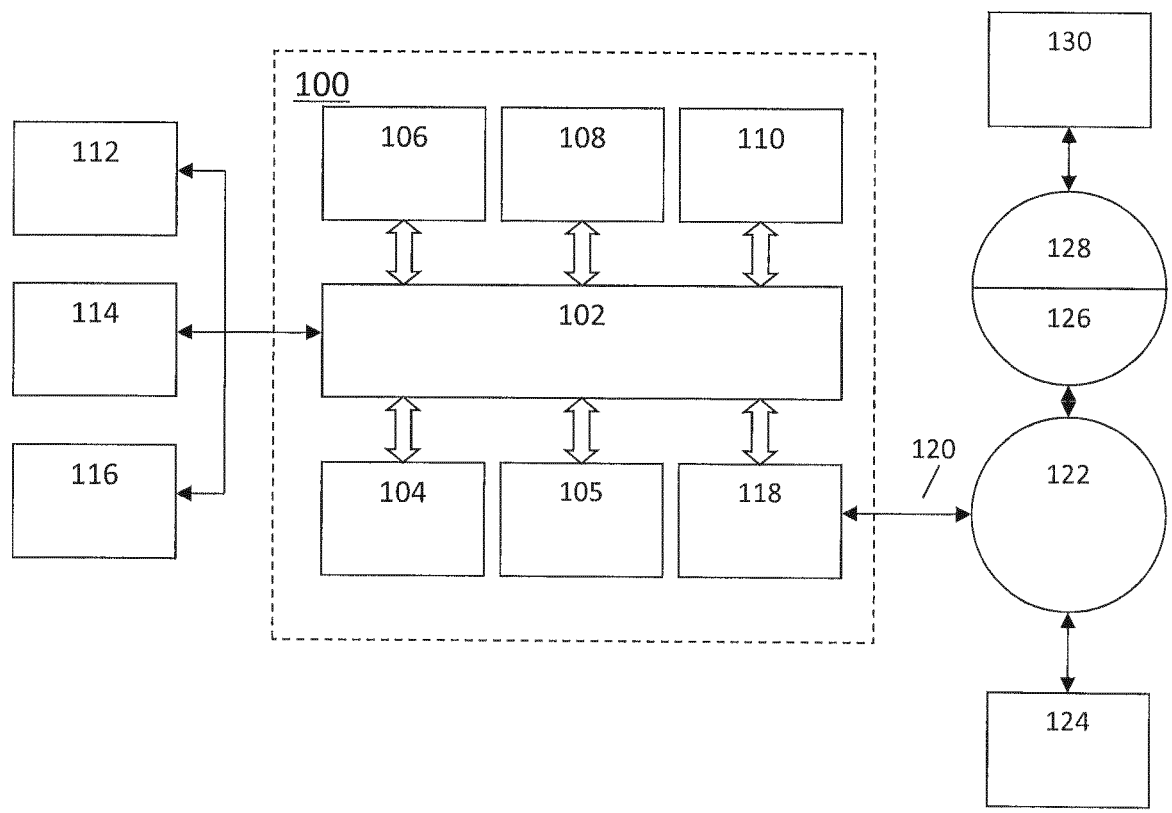
FIG. 11 is a block diagram of an example computer system.

FIG. 11 is a block diagram that illustrates a computer system 100 which can assist in implementing the optimization methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the optimization process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 12:
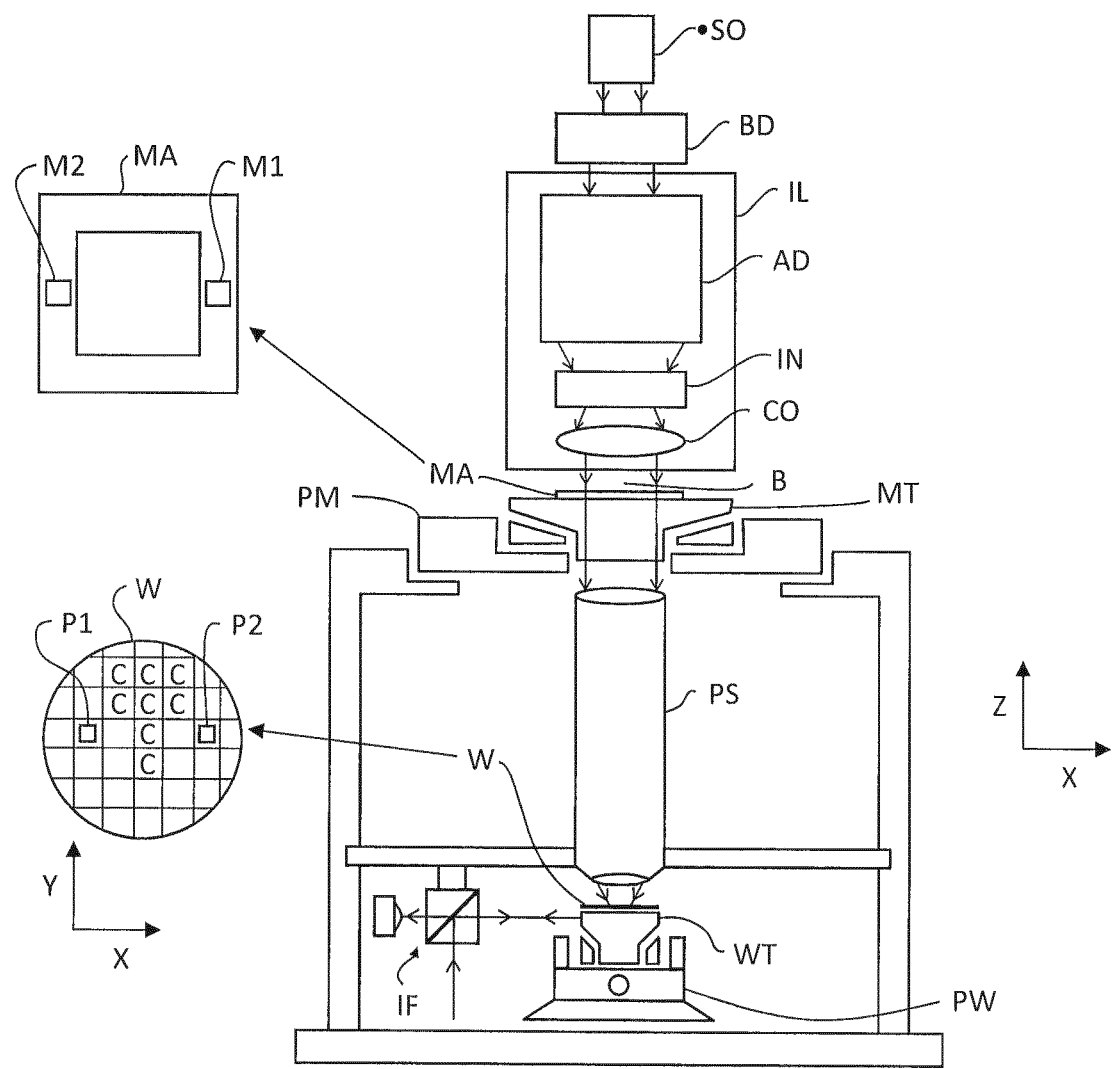
FIG. 12 is a schematic diagram of a lithographic projection apparatus.

FIG. 12 schematically depicts an exemplary lithographic projection apparatus whose illumination could be optimized utilizing the methods described herein. The apparatus comprises:

- an illumination system IL, to condition a beam B of radiation. In this particular case, the illumination system also comprises a radiation source SO;
- a first object table (e.g., patterning device table) MT provided with a patterning device holder to hold a patterning device MA (e.g., a reticle), and connected to a first positioner to accurately position the patterning device with respect to item PS;
- a second object table (substrate table) WT provided with a substrate holder to hold a substrate W (e.g., a resist-coated silicon wafer), and connected to a second positioner to accurately position the substrate with respect to item PS;

a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive patterning device). However, in general, it may also be of a reflective type, for example (with a reflective patterning device). The apparatus may employ a different kind of patterning device to classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 12 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam PB subsequently intercepts the patterning device MA, which is held on a patterning device table MT. Having traversed the patterning device MA, the beam B passes through the lens PL, which focuses the beam B onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 12. However, in the case of a stepper (as opposed to a step-and-scan tool) the patterning device table MT may just be connected to a short stroke actuator, or may be fixed.

The depicted tool can be used in two different modes:

In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 13:
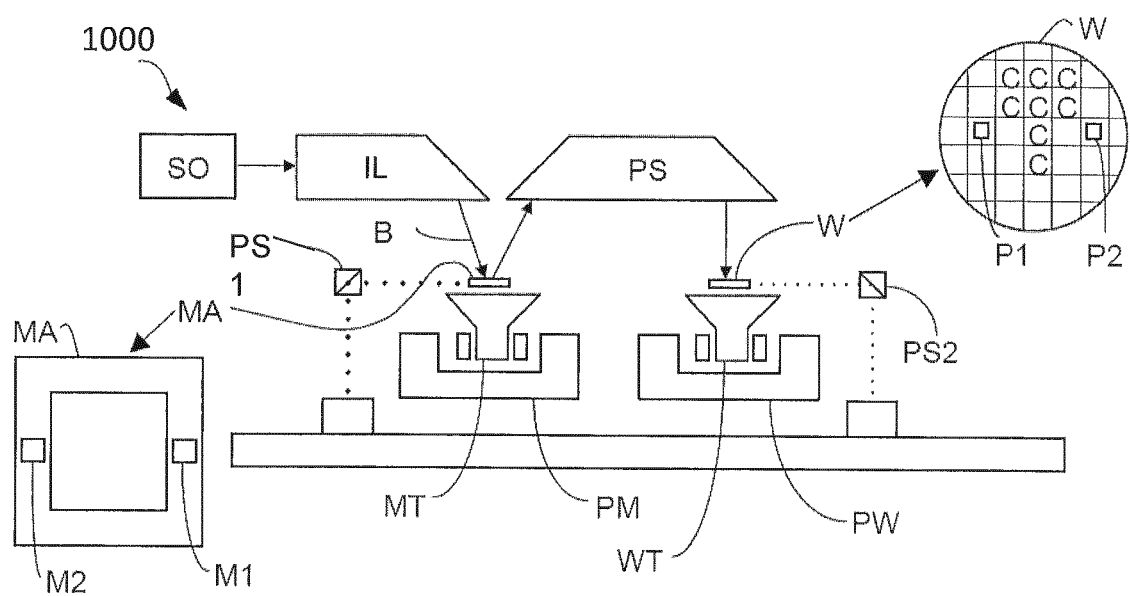
FIG. 13 is a schematic diagram of another lithographic projection apparatus.

FIG. 13 schematically depicts another exemplary lithographic projection apparatus 1000 whose illumination could be optimized utilizing the methods described herein.

The lithographic projection apparatus 1000 comprises:

a source collector module SO an illumination system (illuminator) IL configured to condition a radiation beam B (e.g. EUV radiation).

a support structure (e.g. a patterning device table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective patterning device). It is to be noted that because most materials are absorptive within the EUV wavelength range, the patterning device may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 13, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 13, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as o-outer and o-inner, respectively) of the intensity distribution in a pupil plane of the illuminator can be adjusted.

In addition, the illuminator IL may comprise various other components, such as facetted field and pupil minor devices. The illuminator may be used to condition the radiation beam, to have a desired uniformity and intensity distribution in its cross section.

The radiation beam B is incident on the patterning device (e.g., mask) MA, which is held on the support structure (e.g., patterning device table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 could be used in at least one of the following modes:

1. In step mode, the support structure (e.g. patterning device table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. patterning device table) MT and the substrate table WT are scanned synchronously while a pattern imparted to the radiation beam is projected onto a target portion C (i.e. a single dynamic exposure). The velocity and direction of the substrate table WT relative to the support structure (e.g. patterning device table) MT may be determined by the (de-)magnification and image reversal characteristics of the projection system PS.

3. In another mode, the support structure (e.g. patterning device table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan.

This mode of operation can be readily applied to maskless lithography that utilizes programmable patterning device, such as a programmable mirror array of a type as referred to above.

Figure 14:
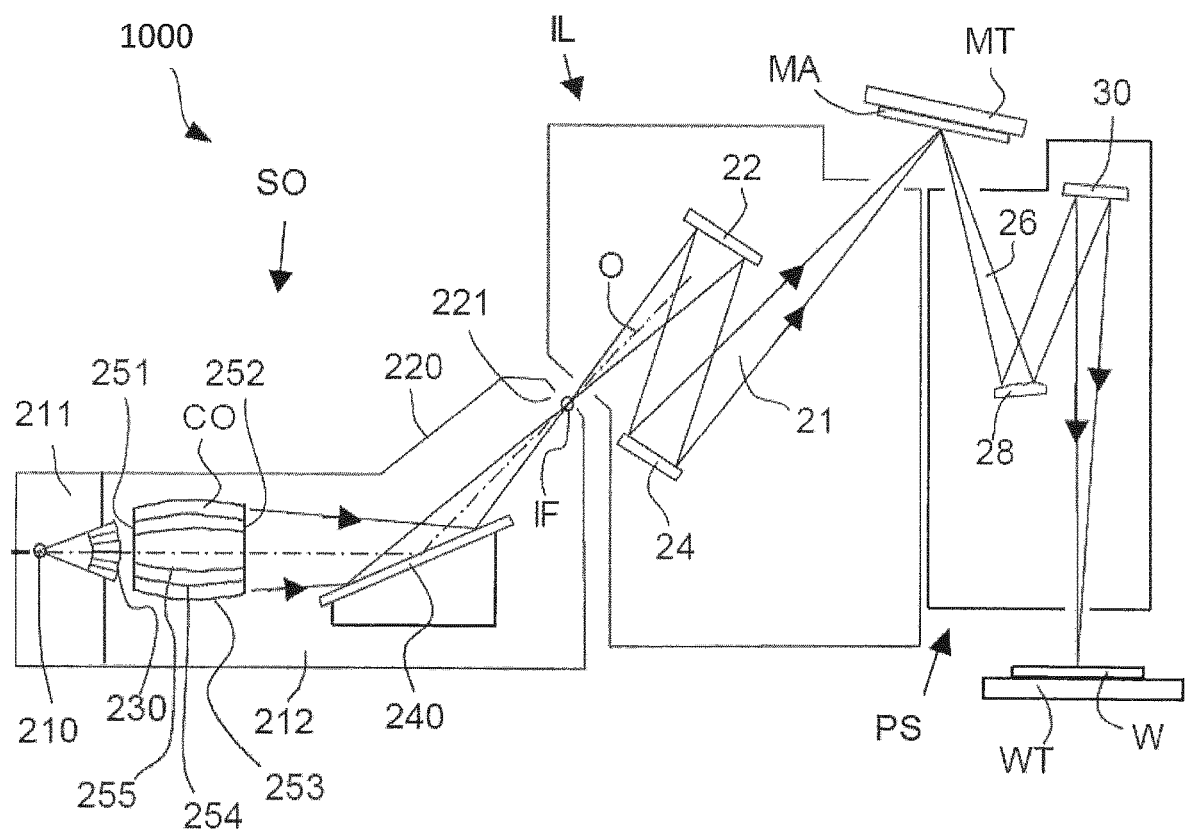
FIG. 14 is a more detailed view of the apparatus in FIG. 13.

FIG. 14 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 14.

Collector optic CO, as illustrated in FIG. 14, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type may be used in combination with a discharge produced plasma source, often called a DPP source.

Figure 15:
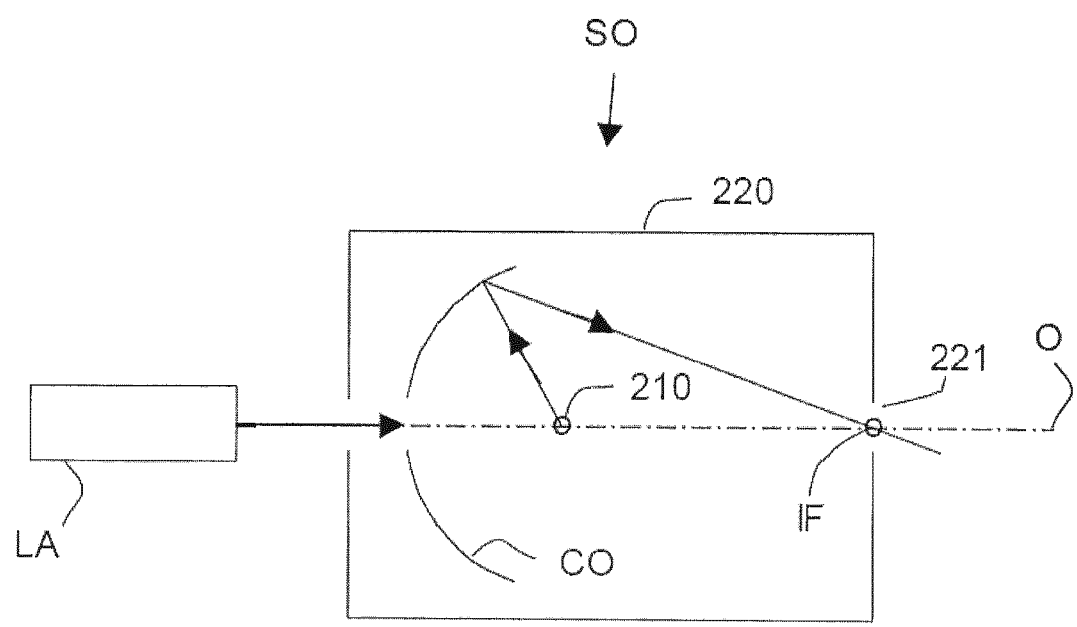
FIG. 15 is a more detailed view of the source collector module SO of the apparatus of FIG. 13 and FIG. 14.

Alternatively, the source collector module SO may be part of an LPP radiation system as shown in FIG. 15. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

U.S. Patent Application Publication No. US 2013-0179847 is hereby incorporated by reference in its entirety.

The embodiments may further be described using the following clauses:

1. A method to improve a lithographic process of imaging a portion of a design layout onto a substrate using a lithographic apparatus, the method comprising:

computing, by a computer, a multi-variable cost function, the multi-variable cost function representing an interlayer characteristic, the interlayer characteristic being a function of a plurality of design variables that represent one or more characteristics of the lithographic process; and reconfiguring one or more of the characteristics of the lithographic process by adjusting one or more of the design variables until a certain termination condition is satisfied.

2. The method of clause 1, wherein the interlayer characteristic is a distance between a first edge of a first pattern and a second edge of a second pattern, wherein the first edge faces the second edge; wherein the first pattern and the second pattern do not overlap; wherein the first pattern and the second pattern are in different layers on the substrate.

3. The method of clause 1, wherein the interlayer characteristic is a distance between a first edge of a first pattern and a second edge of a second pattern; wherein the first pattern and the second pattern overlap; wherein the first pattern and the second pattern are in different layers on the substrate.

4. The method of clause 1, wherein the interlayer characteristic is an overlapping area between a first pattern and a second pattern; wherein the first pattern and the second pattern are in different layers on the substrate.

5. The method of clause 1, wherein the interlayer characteristic is a distance between a first edge of a first pattern and a second edge of a second pattern; wherein the first pattern and the second pattern do not overlap; wherein the first edge and the second edge do not face each other.

6. The method of any one of clauses 1 to 5, wherein the first pattern is a structure etched into the substrate.

7. The method of any one of clauses 1 to 5, wherein the second pattern is a pattern in an aerial image, in a resist image, or in an etched image.

8. The method of any one of clauses 1 to 5, wherein computing the multi-variable cost function comprises simulating the first pattern or the second pattern.

9. The method of any of clauses 1 to 8, wherein reconfiguring the one or more of the characteristics of the lithographic process improves an image quality of the portion of the design layout.

10. The method of any of clauses 1 to 8, wherein reconfiguring the one or more of the characteristics of the lithographic process increases latitude of at least one of the design variables.

11. The method of clause 10, wherein the latitude is depth of focus or exposure latitude.

12. The method of any of clauses 1 to 8, wherein reconfiguring the one or more of the characteristics of the lithographic process increases a size of a process window.

13. The method of any of clauses 1 to 12, wherein the cost function represents one or more selected from the following: edge placement error, critical dimension, resist contour distance, worst defect size, overlapping area of two contours and/or best focus shift.

14. The method of any of clauses 1 to 13, wherein the portion of the design layout comprises one or more selected from the following: an entire design layout, a clip, a section of a design layout that is known to have a critical feature, a section of the design layout where a hot spot or a warm spot has been identified, and/or a section of the design layout where a critical feature has been identified.

15. The method of any of clauses 1 to 14, wherein the termination condition comprises one or more selected from the following: minimization of the cost function; maximization of the cost function; reaching a certain number of iterations; reaching a value of the cost function equal to or beyond a certain threshold value; reaching a certain computation time; reaching a value of the cost function within an acceptable error limit; and/or minimizing an exposure time in the lithographic process.

16. The method of any of clauses 1 to 15, wherein one or more of the design variables represent one or more characteristics of an illumination by the lithographic apparatus, and/or one or more of the design variables represented one or more characteristics of the design layout, and/or one or more of the design variables represent one or more characteristics of projection optics of the lithographic apparatus, and/or one or more of the design variables represent one or more characteristics of a resist of the substrate, and/or one or more of the design variables represent one or more characteristics of an aerial image or a resist image.

17. The method of clause 16, wherein the aerial image or the resist image is a simulated image.

18. The method of any of clauses 1 to 17, wherein the reconfiguration comprises a constraint dictating a range of at least one of the design variables.

19. The method of any of clauses 1 to 18, wherein the cost function is minimized or maximized by a method selected from a group consisting of the Gauss-Newton algorithm, the Levenberg-Marquardt algorithm, the Broyden-Fletcher-Goldfarb-Shanno algorithm, the gradient descent algorithm, the simulated annealing algorithm, the interior point algorithm, and the genetic algorithm.

20. A computer program product comprising a computer non-transitory readable medium having instructions recorded thereon, the instructions when executed by a computer implementing a method to improve a lithographic process of imaging a portion of a design layout onto a substrate using a lithographic apparatus, the method comprising:

computing a multi-variable cost function, the multi-variable cost function representing an interlayer characteristic, the interlayer characteristic being a function of a plurality of design variables that represent one or more characteristics of the lithographic process; and reconfiguring one or more of the characteristics of the lithographic process by adjusting one or more of the design variables until a certain termination condition is satisfied.

21. The computer program product of clause 20, wherein the interlayer characteristic is a distance between a first edge of a first pattern and a second edge of a second pattern, wherein the first edge faces the second edge; wherein the first pattern and the second pattern do not overlap; wherein the first pattern and the second pattern are in different layers on the substrate.

22. The computer program product of clause 20, wherein the interlayer characteristic is a distance between a first edge of a first pattern and a second edge of a second pattern; wherein the first pattern and the second pattern overlap; wherein the first pattern and the second pattern are in different layers on the substrate.

23. The computer program product of clause 20, wherein the interlayer characteristic is an overlapping area between a first pattern and a second pattern; wherein the first pattern and the second pattern are in different layers on the substrate.

24. The computer program product clause 20, wherein the interlayer characteristic is a distance between a first edge of a first pattern and a second edge of a second pattern; wherein the first pattern and the second pattern do not overlap; wherein the first edge and the second edge do not face each other.

25. The computer program product of any one of clauses 20 to 24, wherein the first pattern is a structure etched into the substrate.

26. The computer program product of any one of clauses 20 to 24, wherein the first pattern is a structure etched into the substrate.

27. The computer program product of any one of clauses 20 to 24, wherein the second pattern is a pattern in an aerial image or in a resist image.

28. The computer program product of any one of clauses 20 to 24, wherein computing the multi-variable cost function comprises simulating the first pattern or the second pattern.

29. The computer program product of any of clauses 20 to 28, wherein reconfiguring the one or more of the characteristics of the lithographic process improves an image quality of the portion of the design layout.

30. The computer program product of any of clauses 20 to 28, wherein reconfiguring the one or more of the characteristics of the lithographic process increases latitude of at least one of the design variables.

31. The computer program product of clause 30, wherein the latitude is depth of focus or exposure latitude.

32. The computer program product of any of clauses 20 to 28, wherein reconfiguring the one or more of the characteristics of the lithographic process increases a size of a process window.

33. The computer program product of any of clauses 20 to 32, wherein the cost function represents one or more selected from the following: edge placement error, critical dimension, resist contour distance, worst defect size, overlapping area of two contours and/or best focus shift.

34. The computer program product of any of clauses 20 to 33, wherein the portion of the design layout comprises one or more selected from the following: an entire design layout, a clip, a section of a design layout that is known to have a critical feature, a section of the design layout where a hot spot or a warm spot has been identified, and/or a section of the design layout where a critical feature has been identified.

35. The method of any of clauses 20 to 34, wherein the termination condition comprises one or more selected from the following: minimization of the cost function; maximization of the cost function; reaching a certain number of iterations; reaching a value of the cost function equal to or beyond a certain threshold value; reaching a certain computation time; reaching a value of the cost function within an acceptable error limit; and/or minimizing an exposure time in the lithographic process.

36. The method of any of clauses 20 to 35, wherein one or more of the design variables represent one or more characteristics of an illumination by the lithographic apparatus, and/or one or more of the design variables represented one or more characteristics of the design layout, and/or one or more of the design variables represent one or more characteristics of projection optics of the lithographic apparatus, and/or one or more of the design variables represent one or more characteristics of a resist of the substrate, and/or one or more of the design variables represent one or more characteristics of an aerial image or a resist image.

37. The method of clause 36, wherein the aerial image or the resist image is a simulated image.

38. The method of any of clauses 20 to 37, wherein the reconfiguration comprises a constraint dictating a range of at least one of the design variables.

39. The method of any of clauses 20 to 38, wherein the cost function is minimized or maximized by a method selected from a group consisting of the Gauss-Newton algorithm, the Levenberg-Marquardt algorithm, the Broyden-Fletcher-Goldfarb-Shanno algorithm, the gradient descent algorithm, the simulated annealing algorithm, the interior point algorithm, and the genetic algorithm.

So, disclosed herein is a method to improve a lithographic process of imaging a portion of a design layout onto a substrate using a lithographic apparatus, the method comprising: computing, by a computer, a multi-variable cost function, the multi-variable cost function being a function of a bandwidth of a radiation source of the lithographic apparatus, or being a function of a variable that is a function of the bandwidth or that affects the bandwidth, the bandwidth being one of a plurality of design variables that represent one or more characteristics of the lithographic process or being a function of one or more of the plurality of design variables representing an interlayer characteristic, the interlayer characteristic being a function of a plurality of design variables that represent one or more characteristics of the lithographic process; and reconfiguring, by a computer, one or more of the characteristics of the lithographic process by adjusting one or more of the design variables until a certain termination condition is satisfied.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

What is claimed is:

1. A method to improve a lithographic process of imaging a portion of a design layout onto a substrate using a lithographic apparatus, the method comprising:

computing, by a hardware computer system, a multi-variable cost function, the multi-variable cost function representing an interlayer characteristic relating to at least part of the design layout and representing a further characteristic relating to the design layout, the interlayer characteristic being a function of a plurality of design variables that represent one or more characteristics of the lithographic process and the interlayer characteristic being a characteristic of an aspect in one layer relative to another aspect in another different layer, and the interlayer characteristic having a different weighting than the further characteristic; and reconfiguring one or more of the characteristics of the lithographic process by adjusting one or more of the design variables and computing the multi-variable cost function with the adjusted one or more design variables, until a certain termination condition is satisfied.

2. The method of claim 1, wherein the interlayer characteristic is a distance between a first edge of a first pattern and a second edge of a second pattern.

3. The method of claim 2, wherein the first pattern corresponds to a structure etched into the substrate.

4. The method of claim 2, wherein the second pattern corresponds to a pattern in an aerial image, in a resist image, or in an etched image.

5. The method of claim 2, wherein computing the multi-variable cost function comprises simulating the first pattern or the second pattern.

6. The method of claim 2, wherein the first pattern and the second pattern do not overlap, and/or wherein the first pattern and the second pattern are in different layers on the substrate.

7. The method of claim 1, wherein reconfiguring the one or more of the characteristics of the lithographic process improves an image quality of the portion of the design layout, or wherein reconfiguring the one or more of the characteristics of the lithographic process increases latitude of at least one of the design variables, or wherein reconfiguring the one or more of the characteristics of the lithographic process increases a size of a process window.

8. The method of claim 7, wherein reconfiguring the one or more of the characteristics of the lithographic process increases latitude of at least one of the design variables and wherein the latitude is depth of focus or exposure latitude.

9. The method of claim 1, wherein the cost function represents one or more selected from the following: edge placement error, critical dimension, resist contour distance, worst defect size, overlapping area of two contours and/or best focus shift.

10. The method of claim 1, wherein the portion of the design layout comprises one or more selected from the following: an entire design layout, a clip, a section of a design layout that is known to have a critical feature, a section of the design layout where a hot spot or a warm spot has been identified, and/or a section of the design layout where a critical feature has been identified.

11. The method of claim 1, wherein one or more of the design variables represent one or more characteristics of an illumination by the lithographic apparatus, and/or one or more of the design variables represent one or more characteristics of the design layout, and/or one or more of the design variables represent one or more characteristics of projection optics of the lithographic apparatus, and/or one or more of the design variables represent one or more characteristics of a resist of the substrate, and/or one or more of the design variables represent one or more characteristics of an aerial image or a resist image.

12. The method of claim 1, wherein reconfiguring the one or more of the characteristics of the lithographic process involves use of a constraint dictating a range of at least one of the design variables.

13. The method of claim of claim 1, wherein the further characteristic is an interlayer characteristic relating to at least another part of the design layout.

14. A computer program product comprising a non-transitory computer readable medium having instructions therein, the instructions, upon execution by a computer system, configured to cause the computer system to at least:

compute a multi-variable cost function, the multi-variable cost function representing an interlayer characteristic relating to at least part of the design layout and representing a further characteristic relating to the design layout, the interlayer characteristic being a function of a plurality of design variables that represent one or more characteristics of a lithographic process of imaging a portion of a design layout onto a substrate using a lithographic apparatus and the interlayer characteristic being a characteristic of an aspect in one layer relative to another aspect in another different layer, and the interlayer characteristic having a different weighting than the further characteristic; and reconfigure one or more of the characteristics of the lithographic process by adjusting one or more of the design variables and compute the multi-variable cost function with the adjusted one or more design variables, until a certain termination condition is satisfied.

15. The computer program product of claim 14, wherein the interlayer characteristic is a distance between a first edge of a first pattern and a second edge of a second pattern.

16. The computer program product of claim 15, wherein the first pattern corresponds to a structure etched into the substrate, or wherein the second pattern corresponds to a pattern in an aerial image or in a resist image.

17. The computer program product of claim 15, wherein the instructions configured to compute the multi-variable cost function are configured to perform a simulation of the first pattern or the second pattern.

18. The computer program product of claim 15, wherein the first pattern and the second pattern do not overlap, and/or wherein the first pattern and the second pattern are in different layers on the substrate.

19. The computer program product of claim 15, wherein the further characteristic is an interlayer characteristic relating to at least another part of the design layout.

20. The computer program product of claim 14, wherein the interlayer characteristic is a distance between a first edge of a first pattern and a second edge of a second pattern, wherein the first edge faces the second edge, wherein the first pattern and the second pattern do not overlap, and wherein the first pattern and the second pattern are in different layers on the substrate.

* * * * *